(12) United States Patent
Fujita et al.

(10) Patent No.: US 11,195,782 B2
(45) Date of Patent: Dec. 7, 2021

(54) SEMICONDUCTOR DEVICE AND MANUFACTURING METHOD THEREOF

(71) Applicant: RENESAS ELECTRONICS CORPORATION, Tokyo (JP)

(72) Inventors: Naoki Fujita, Tokyo (JP); Hiroyuki Nakamura, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 109 days.

(21) Appl. No.: 16/380,651

(22) Filed: Apr. 10, 2019

(65) Prior Publication Data
US 2019/0341339 A1   Nov. 7, 2019

(30) Foreign Application Priority Data
May 1, 2018   (JP) .............................. JP2018-088248

(51) Int. Cl.
*H01L 23/495*   (2006.01)
*H03K 17/0814*   (2006.01)
(Continued)

(52) U.S. Cl.
CPC .. *H01L 23/49537* (2013.01); *H01L 23/49541* (2013.01); *H01L 24/06* (2013.01);
(Continued)

(58) Field of Classification Search
CPC . H01L 2224/32245; H01L 2224/73265; H01L 2224/97; H01L 2924/00014; H01L 2224/48247; H01L 2224/84; H01L 2924/00; H01L 2224/291; H01L 2224/37147; H01L 2224/48257; H01L 2224/92247; H01L 2224/83; H01L 2224/85; H01L 2924/00012; H01L 2924/014; H01L 2224/04034; H01L 2224/04042; H01L 2224/05551; H01L 2224/05552; H01L 2224/0603; H01L 2224/06051; H01L 2224/4813; H01L 2224/4903; H01L 2224/73221;
(Continued)

(56) References Cited

U.S. PATENT DOCUMENTS 9,837,515 B2   12/2017   Nagata
2013/0265029 A1*   10/2013   Akiyama ............. H03K 17/162
                                                           323/311

(Continued)

FOREIGN PATENT DOCUMENTS

JP   2014-219335 A   11/2014
JP   2017-063124 A   3/2017
JP   2017-143188 A   8/2017

OTHER PUBLICATIONS

Japanese Notice of Reeason for Refusal issued in corresponding Japanese Patent Application No. 2018-088248, dated Aug. 17, 2021, with English translation.

*Primary Examiner* — Asok K Sarkar
*Assistant Examiner* — Dmitriy Yemelyanov
(74) *Attorney, Agent, or Firm* — McDermott Will & Emery LLP

(57) ABSTRACT

Reliability of a semiconductor device is improved. In the semiconductor device SA1, a snubber capacitor pad SNP electrically connected to the capacitor electrode of the snubber capacitor is formed on the surface of the semiconductor chip CHP.

15 Claims, 27 Drawing Sheets

(51) Int. Cl.
    *H02M 3/335* (2006.01)
    *H01L 29/78* (2006.01)
    *H01L 23/00* (2006.01)
    *H02M 1/34* (2007.01)

(52) U.S. Cl.
    CPC .............. *H01L 24/48* (2013.01); *H01L 24/73* (2013.01); *H01L 29/7813* (2013.01); *H02M 1/34* (2013.01); *H02M 3/335* (2013.01); *H03K 17/08142* (2013.01); *H01L 2224/0603* (2013.01); *H01L 2224/48247* (2013.01); *H01L 2224/73265* (2013.01); *H01L 2924/13055* (2013.01); *H01L 2924/13091* (2013.01); *H02M 1/348* (2021.05)

(58) Field of Classification Search
    CPC . H01L 2224/73263; H01L 2224/83192; H01L 2224/85455; H01L 2224/92246; H01L 22/14; H01L 22/20; H01L 23/49524; H01L 23/49537; H01L 23/49541; H01L 23/49562; H01L 24/05; H01L 24/06; H01L 24/29; H01L 24/32; H01L 24/37; H01L 24/40; H01L 24/48; H01L 24/49; H01L 24/73; H01L 24/92; H01L 27/0629; H01L 2924/13055; H01L 2924/13091; H01L 29/0634; H01L 29/1095; H01L 29/417; H01L 29/41766; H01L 29/7397; H01L 29/7813

See application file for complete search history.

(56) References Cited

U.S. PATENT DOCUMENTS

2016/0204099 A1* 7/2016 Kawai ................ H01L 29/1095
                                                              257/139
    2017/0229572 A1  8/2017 Nagase et al.

* cited by examiner

<A SCREENING STEP OF PERFORMING A SCREENING TEST>

<AN ASSEMBLING PROCESS AFTER PERFORMING A SCREENING TEST>

SEMICONDUCTOR DEVICE AND MANUFACTURING METHOD THEREOF

CROSS-REFERENCE TO RELATED APPLICATIONS

The disclosure of Japanese Patent Application No. 2018-088248 filed on May 1, 2018 including the specification, drawings and abstract is incorporated herein by reference in its entirety.

BACKGROUND

The present invention relates to a semiconductor device and a manufacturing technique thereof, and, for example, to a semiconductor device having a snubber capacitor and a technique effective for the manufacturing technique thereof.

Japanese unexamined Patent Application publications No. 2017-63124 and 2017-143188 describe techniques relating to a semiconductor device in which a snubber capacitor is formed inside a semiconductor chip.

SUMMARY

In a semiconductor device including a power transistor, a snubber capacitor connected in parallel with the power transistor may be used in order to attenuate a surge voltage included in an output voltage from the power transistor to prevent element breakdown and suppress generation of an electromagnetic interference wave based on the surge voltage. In particular, as a result of the examination by the inventor, it has been clarified that there is a new room for improvement when the snubber capacitor is provided inside the semiconductor chip in which the power transistor is formed, which has not appeared in the configuration in which the snubber capacitor is provided outside the semiconductor chip. Therefore, in a semiconductor device having a configuration in which a snubber capacitor is provided inside a semiconductor chip in which a power transistor is formed, it is desired to devise the new room for improvement that becomes apparent.

Other objects and novel features will become apparent from the description of this specification and the accompanying drawings.

In the semiconductor device according to one embodiment, a snubber capacitor pad electrically connected to the capacitor electrode of the snubber capacitor is formed on the surface of the semiconductor chip.

According to the embodiment, reliability of the semiconductor device can be improved.

DETAILED DESCRIPTION

Figure 1:
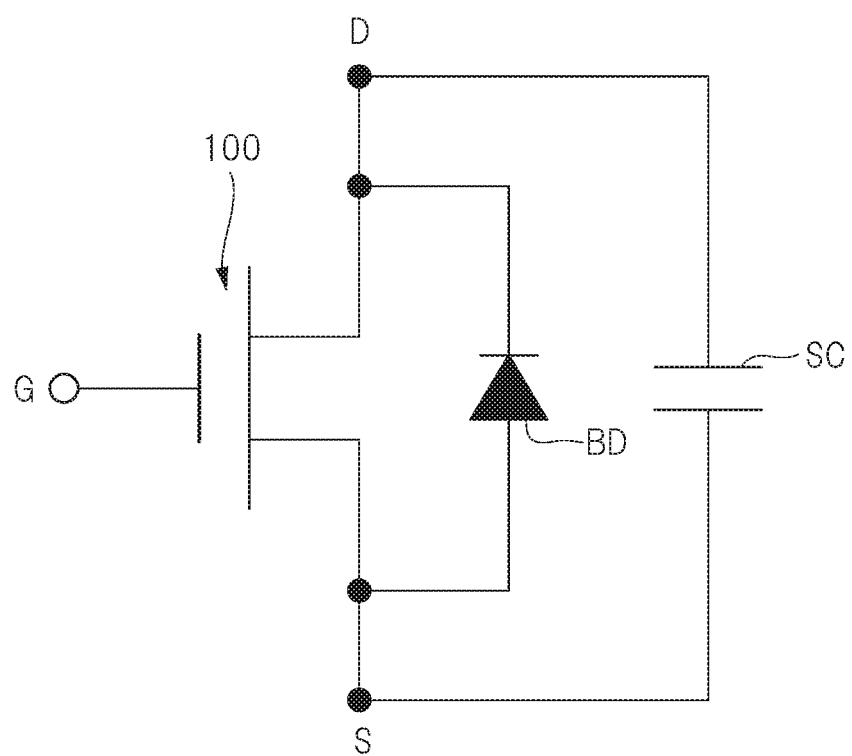
FIG. 1 is a circuit diagram illustrating an example of a circuit configuration for suppressing a surge voltage.

In the following embodiments, when it is necessary for convenience, the description will be made by dividing into a plurality of sections or embodiments, but except for the case specifically specified, these sections and embodiments are not independent of each other, and one of them is related to some or all of modified examples, details, supplementary description, and the like of the other.

In the following embodiments, the number of elements, etc. (including the number of elements, numerical values, quantities, ranges, etc.) is not limited to the specific number, but may be not less than or equal to the specific number and may be not more than or equal to the specific number, except for cases where the number is specifically indicated and is clearly limited to the specific number in principle.

Furthermore, in the following embodiments, it is needless to say that the constituent elements (including element steps and the like) are not necessarily essential except in the case where they are specifically specified and the case where they are considered to be obviously essential in principle.

Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

In all the drawings for explaining the embodiments, the same members are denoted by the same reference numerals in principle, and repetitive descriptions thereof are omitted. In order to make the drawings easy to understand, hatching may be used even in a plan view.

Snubber Capacitor to Reduce a Surge Voltage

In an actual power transistor, a surge voltage is generated at the time of turn-on or turn-off due to the influence of a parasitic inductance. If the surge voltage exceeds the withstand voltage of the power transistor, the power transistor is destroyed. Further, when the surge voltage is generated, electromagnetic noise caused by the surge voltage is generated, and there is a concern that an adverse effect represented by a malfunction caused by the electromagnetic noise to the peripheral device is caused. Therefore, it is necessary to suppress a surge voltage generated at the time of turn-on or turn-off.

FIG. 1 is a circuit diagram showing an example of a circuit configuration for suppressing a surge voltage. In FIG. 1, a power MOSFET 100, which is a type of power transistor, is configured to control a drain current flowing between a drain D and a source S by controlling a gate voltage applied to gate electrodes G. That is, when a gate voltage equal to or higher than the threshold voltage is applied to the gate electrode G, an inversion layer serving as a current path is formed between the drain D and the source S, and a drain current flows between the drain D and the source S. On the other hand, when a gate voltage smaller than the threshold voltage is applied to the gate electrode G, the inversion layer formed between the drain D and the source S disappears, and a drain current does not flow between the drain D and the source S.

A snubber capacitor SC is provided so as to be connected in parallel with the power MOSFET 100 configured as described above. As a result, in the circuit shown in FIG. 1, it is possible to suppress surge voltages generated when the power MOSFET 100 is turned on or turned off. The reason for this will be described below. In the circuit shown in FIG. 1, the body diode BD connected in antiparallel with the power MOSFET 100 is a diode formed parasitically due to the device structure of the power MOSFET 100.

For example, in FIG. 1, when the power MOSFET 100 is turned off, a back electromotive force (surge voltage) based on parasitic inductances is generated. The back electromotive force is proportional to the magnitude of the parasitic inductance and also proportional to the rate of change of current. That is, when the power MOSFET 100 is turned off, the current that has been flowing does not flow, so that the current change rate becomes large. Therefore, a large back electromotive force is generated at the time of turn-off.

At this time, as shown in FIG. 1, when the snubber capacitor SC is connected in parallel with the power MOSFET 100, the charges accumulated in the snubber capacitor SC are discharged, thereby alleviating a sudden current change when the power MOSFET 100 is turned off. As a result, in the circuit shown in FIG. 1, since the current change rate is smaller in the circuit than in the case of a single power MOSFET 100 without a snubber capacity SC, the magnitude of the back electromotive force (surge voltage) to be proportional to the current change rate is smaller. This means that by connecting the snubber capacitor SC in parallel with the power MOSFET 100, the generation of large surge voltages can be suppressed. As described above, by connecting the snubber capacitor SC in parallel with the power MOSFET 100, the generation of large surge voltages can be suppressed. As a result, it is possible to suppress the occurrence of electromagnetic noise caused by the surge voltage, and thus it is possible to suppress the occurrence of malfunction caused by the electromagnetic noise to the peripheral device. Furthermore, it is possible to suppress breakdown of the power MOSFET 100 caused by large surge voltages.

Benefits of Providing a Snubber Capacitor Inside a Semiconductor Chip

For example, the snubber capacitor described above is generally provided outside the semiconductor chip on which the power MOSFET is formed. However, when the snubber capacitor is provided outside the semiconductor chip on which the power MOSFET is formed, the parasitic inductance increases because the length of the wire connecting the power MOSFET and the snubber capacitor increases. Since the magnitude of the back electromotive force (surge voltage) is proportional to the magnitude of the parasitic inductance, as the parasitic inductance increases, the back electromotive force (surge voltage) based on the parasitic inductance increases. Therefore, in the configuration (external arrangement) in which the snubber capacitor is provided outside the semiconductor chip in which the power MOSFET is formed, it is difficult to reduce the magnitude of the parasitic inductance while the current change rate can be reduced by the snubber capacitor, and therefore, it is difficult to effectively suppress the generation of a large back electromotive force (surge voltage).

In this regard, it has been investigated to provide snubber capacitors inside the semiconductor chip on which the power MOSFET is formed. In the configuration in which the snubber capacitor is provided inside the semiconductor chip in which the power MOSFET is formed, the length of the wire connecting the power MOSFET and the snubber capacitor can be made shorter than in the configuration in which the snubber capacitor is externally provided. This means that the parasitic inductance can be reduced. Therefore, the configuration in which the snubber capacitor is provided inside the semiconductor chip in which the power MOSFET is formed can effectively suppress the generation of a large back electromotive force (surge voltage) by a synergistic effect of the effect that the snubber capacitor can alleviate the current change rate at the time of switching and the effect that the parasitic inductances can be reduced by shortening the length of the wire connecting the power MOSFET and the snubber capacitor. That is, it is understood that the configuration in which the snubber capacitor is provided inside the semiconductor chip in which the power MOSFET is formed is beneficial from the viewpoint of effectively suppressing generation of a large back electromotive force (surge voltage). Further, in the configuration in which the snubber capacitor is provided inside the semiconductor chip in which the power MOSFET is formed, it is possible to reduce the component mounting area and the number of components on the mounting board for mounting the semiconductor device, as compared with the configuration in which the snubber capacitor is externally attached.

Necessity of Screening Test

Here, if a configuration in which a snubber capacitor is provided inside a semiconductor chip in which a power MOSFET is formed is adopted, a reliability test of the snubber capacitor (screening test) is required in a process of manufacturing a semiconductor device including a power MOSFET from the viewpoint of ensuring reliability of the snubber capacitor. This is because, in a semiconductor device in which a snubber capacitor is included in a semiconductor chip in which a power MOSFET is formed, when the snubber capacitor becomes defective, even if the power MOSFET is good, the semiconductor device including the power MOSFET and the snubber capacitor needs to be judged as defective. In other words, in the semiconductor device including the power MOSFET and the snubber capacitor, it is necessary not only to carry out a reliability test for the power MOSFET, but also to carry out a reliability test for the snubber capacitor.

A Room of Improvement Became Apparent

When a configuration in which a snubber capacitor is provided inside a semiconductor chip in which a power MOSFET is formed is adopted from the viewpoint of effectively suppressing generation of a large back electromotive force (surge voltage) as described above, in order to secure reliability of the snubber capacitor, there arises a need to perform a screening test for ensuring reliability of the snubber capacitor in a manufacturing process of a semiconductor device including a power MOSFET and a snubber capacitor. In this regard, the inventor has newly discovered a need to devise a screening test for a snubber capacitor mixed with a power MOSFET. That is, the inventor has found that, when a configuration in which a snubber capacitor is provided inside a semiconductor chip in which a power MOSFET is formed is adopted, a new room for improvement becomes apparent. Therefore, in the following, first, a room for improvement that becomes apparent will be described.

Figure 2:
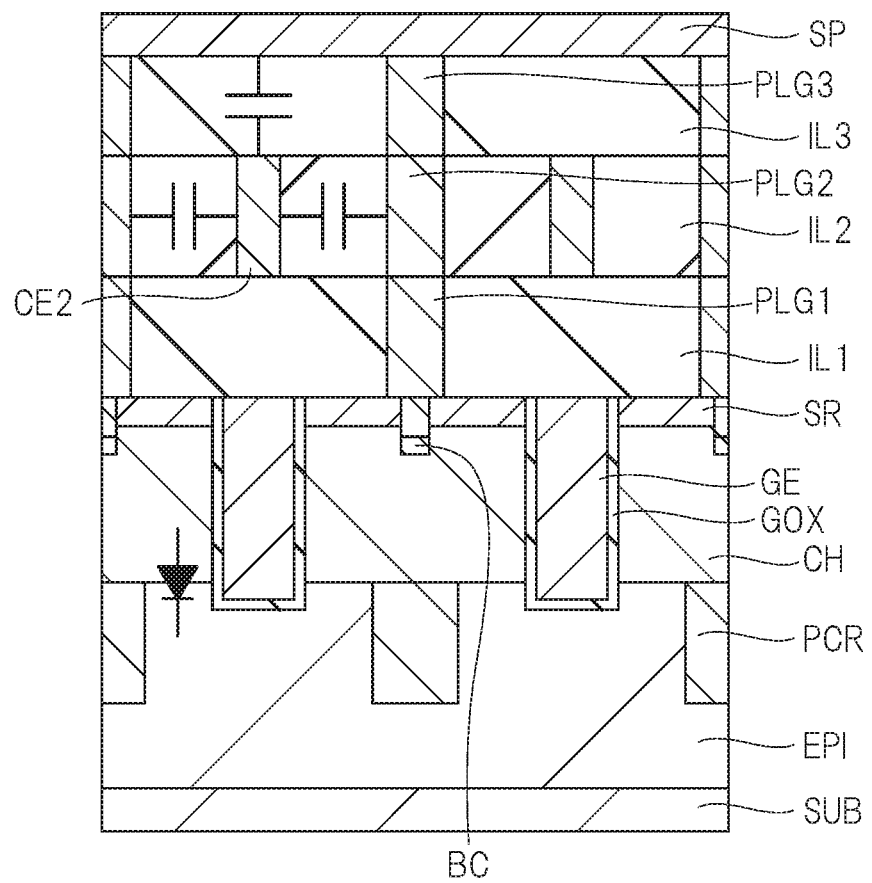
FIG. 2 is a cross-sectional view showing a schematic configuration of a semiconductor device including a power MOSFET and a snubber capacitor.

FIG. 2 is a cross-sectional view showing a schematic configuration of a semiconductor device including a power MOSFET and a snubber capacitor. In FIG. 2, an epitaxial layer (n-type semiconductor layer) EPI is formed on a semiconductor substrate (n-type substrate) SUB, and a channel region (p-type semiconductor region) CH and a p-type column PCR are formed in the epitaxial layer EPI to form a so-called super junction structure.

A trench is formed so as to penetrate the channel region CH and reach the epitaxial layer EPI, and a gate insulating film GOX made of, for example, a silicon oxide film is formed on the inner wall of the trench. Further, a gate electrode GE made of, for example, a polysilicon film is formed so as to bury the inside of the trench with the gate insulating film GOX interposed therebetween. On the other hand, a source region (n-type semiconductor region) is formed on the surface of the channel region CH, and a body contact region (p-type semiconductor region) BC having an impurity concentration higher than that of the channel region CH is formed inside the channel region CH. In this manner, a power MOSFET is formed. That is, the power MOSFET includes gate the electrode GE, the epitaxial layer EPI and the semiconductor substrate SUB functioning as drain regions, and source region SR. At this time, in the power MOSFET having the above-described configuration, a p-n junction diode is parasitically formed by the epitaxial layer EPI, which is the n-type semiconductor layer, and the channel region CH, which is the p-type semiconductor region. This parasitically formed pn junction diode is called a body diode.

Next, in FIG. 2, an interlayer insulating layer IL 1 made of, for example, a silicon oxide film is formed so as to cover the power MOSFET, and a plug PLG1 penetrating the interlayer insulating layer IL 1 is formed in the interlayer insulating layer IL 1. The plug PLG1 is electrically connected to both the source region SR and the body contact region BC.

Next, as shown in FIG. 2, an interlayer insulating layer IL 2 made of, for example, a silicon oxide film is formed on the interlayer insulating layer IL 1 on which the plug PLG1 is formed. At this time, the inter-layer insulating layer IL2 is formed with a plug PLG2 that passes through the inter-layer insulating layer IL2 and is connected to the plug PLG1, and a capacitive electrode CE2 having a snubber capacitor is formed. An interlayer insulating layer IL 3 made of, for example, a silicon oxide film is formed on the interlayer insulating layer IL 2. The interlayer insulating layer IL 3 is formed with a plug PLG3 that penetrates the interlayer insulating layer IL 3 and is connected to the plug PLG2. A source pad SP is formed on the interlayer insulating layer IL3 on which the plug PLG3 is formed. Therefore, the source region SR and the source pad SP are electrically connected to each other through the plug PLG1, the plug PLG2, and the plug PLG3.

Here, as shown in FIG. 2, the snubber capacitor is mainly composed of the capacitor electrode CE 2 formed on the interlayer insulating layer IL 2, the capacitor between the capacitor electrode CE 2 and the opposing plug PLG2, and the capacitor between the capacitor electrode CE 2 and the source pad SP. Though not shown in FIG. 2, the capacitor electrode CE2 is electrically connected to the epitaxial layer EPI serving as the drain region of the power MOSFET. Therefore, the snubber capacitor is connected in parallel between the source region SR and the drain region SR of the power MOSFET.

In particular, in the device structure shown in FIG. 2, the capacitor electrode CE 2 of the snubber capacitor is formed by effectively utilizing the space formed above the gate electrode GE. Therefore, the snubber capacitor can be mixed and mounted on the semiconductor chip on which the power MOSFET is formed without causing an increase in the size of the semiconductor chip.

Here, for example, the silicon oxide film constituting each of the interlayer insulating layer IL 1 to IL 3 is formed by using the plasma-enhanced CVD (Chemical Vapor Deposition) method. At this time, the silicon oxide film formed by the plasma CVD method contains a contaminant. Therefore, for example, since a part of the silicon oxide film constituting the interlayer insulating film IL 2 becomes a capacitor insulating film of the snubber capacitor, the capacitor insulating film of the snubber capacitor is formed of a silicon oxide film formed by the plasma CVD method. The capacitor insulating film of the snubber capacitor is required to have a dielectric strength that does not break down even when a surge voltage is applied. However, in the silicon oxide film formed by the plasma CVD method, there is a possibility that a contaminant is partly mixed, and the dielectric strength of the capacitor insulating film may be lowered due to the contaminant. That is, when the power MOSFET and the snubber capacitor are mounted together as in the device structure shown in FIG. 2, it is required to test whether the dielectric strength of the capacitor insulating film constituting the snubber capacitor is good. This is because such a product needs to be excluded by performing a screening test because the snubber capacitor becomes defective when the insulating defect of the capacitor insulating film constituting the snubber capacitor occurs. Therefore, as described above, in the semiconductor device including the power MOSFET and the snubber capacitor, not only the reliability test for the power MOSFET needs to be performed, but also the reliability test for the snubber capacitor needs to be performed.

In this regard, the inventor has newly found that in a semiconductor device in which a power MOSFET and a snubber capacitor are mounted together, the semiconductor device cannot perform the screening test unless a device is devised to perform the screening test for the snubber capacitor.

In the Case of a Power MOSFET

First, in a semiconductor device on which a power MOSFET and a snubber capacitor are mounted together, it will be explained that the semiconductor device cannot perform the screening test unless a device is devised to perform the screening test of the snubber capacitor.

Figure 3:
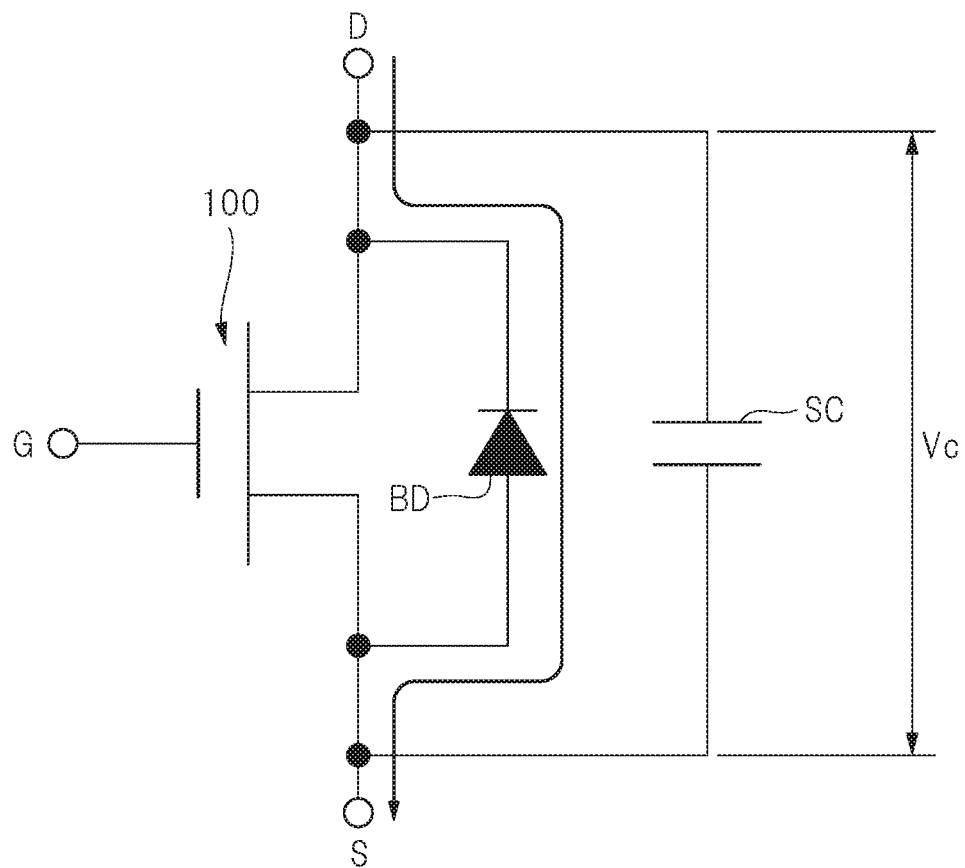
FIG. 3 is a diagram explaining that in a mixed semiconductor device with mixed a power MOSFET and a snubber capacitor, it is illustrated that a screening test cannot be performed without an ingenuity.

FIG. 3 is a diagram for explaining that the screening test cannot be performed in the semiconductor device in which the power MOSFET 100 and the snubber capacitor SC are mounted together unless the semiconductor device is devised. In FIG. 3, the snubber capacitor SC is connected in parallel between the drain D and the source S of the power MOSFET 100. At this time, in a screening test for testing whether the dielectric strength of the capacitor insulating film constituting the snubber capacitor SC is good, a pulse voltage is applied between the capacitor electrodes of the snubber capacitor SC. Then, in a state in which a pulse voltage is applied between the capacitor electrodes of the snubber capacitor SC, by measuring a pulse current flowing through the capacitor insulating film sandwiched between the capacitor electrodes, it is tested whether or not the dielectric strength of the capacitor insulating film constituting the snubber capacitor SC is good.

Figure 4:
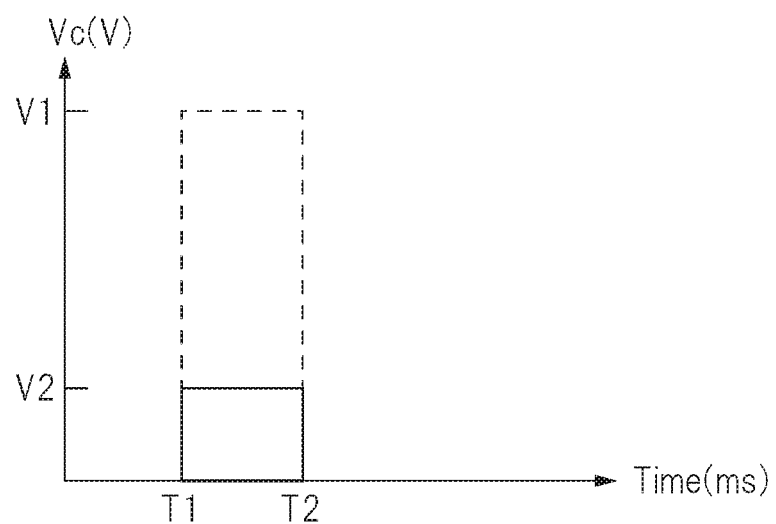
FIG. 4 is a diagram showing a pulse voltage applied between capacitor electrodes of a snubber capacitor.

Specifically, FIG. 4 is a diagram showing a pulse voltage applied between the capacitor electrodes of the snubber capacitor SC. For example, as indicated by a broken line in FIG. 4, in order to test the dielectric strength of the capacitor insulating film constituting the snubber capacitor SC, the voltage Vc is applied between the capacitor electrodes of the snubber capacitor SC. For example, in the screening test, a voltage V1 about four times the source-drain breakdown voltage of the power MOSFET 100 needs to be applied between the capacitor electrodes of the snubber capacitor SC. However, the snubber capacitor SC is connected in parallel between the source S and the drain D of the power MOSFET 100. Therefore, in order to apply the voltage V1 between the capacitor electrodes of the snubber capacitor SC, the voltage V1 is applied between the source S and the drain D of the power MOSFET 100. Here, as shown in FIG. 3, the body diode BD is parasitically formed in the power MOSFET 100 because of the device structure. As a result, when the voltage V1 is applied between the source S and the drain D of the power MOSFET 100 in order to apply the voltage V1 between the capacitor electrodes of the snubber capacitor SC, the voltage V1 is also applied to the parasitically formed body diode BD. In particular, as shown in FIG. 3, since the body diode BD is connected in antiparallel with the power MOSFET, when the voltage V1 is applied between the source S and the drain D of the power MOSFET 100, the voltage V1 is applied as a reverse voltage in the body diode BD. At this time, since the reverse breakdown voltage of the body diode BD is much smaller than the voltage V1, breakdown occurs when the voltage V1 is applied to the body diode BD. That is, even if the voltage V1 is applied between the source S and the drain D of the power MOSFET 100, as a result of being clamped by the body diode BD, only the voltage V2 clamped by the body diode BD is applied between the source S and the drain D of the power MOSFET 100, as shown by the solid line in FIG. 4. This means that although it is necessary to apply the voltage V1 between the capacitor electrodes of the snubber capacitor SC, only the voltage V2 clamped by the body diode BD is applied between the capacitor electrodes of the snubber capacitor SC due to the presence of the body diode BD. This means that the dielectric strength of the capacitor insulating film constituting the snubber capacitor SC cannot be tested. That is, in the semiconductor device in which the power MOSFET 100 and the snubber capacitor SC are mounted together, unless some contrivance is made due to the presence of the body diode BD formed parasitically, the semiconductor device cannot perform the screening test for testing the dielectric strength of the capacitor insulating film constituting the snubber capacitor SC.

In the Case of an IGBT

Figure 5:
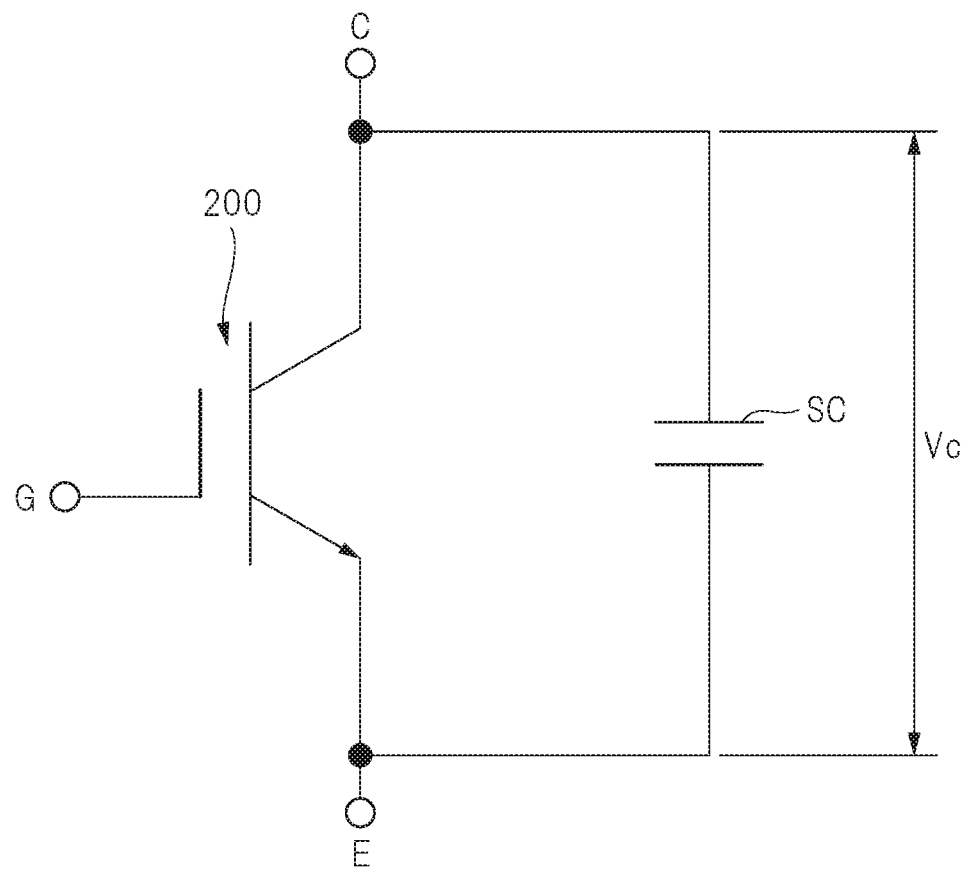
FIG. 5 is a diagram explaining that in the case of a semiconductor device with mixed an IGBT and a snubber capacitor, it is illustrated that a screening test cannot be performed without an ingenuity.

Next, in the case of a semiconductor device that combines power transistor (IGBT (Insulated Gate Bipolar Transistor) and snubber capacitor, it will be explained that the screening test will not be possible if the snubber capacitor screening test is not devised. FIG. 5 is a diagram for explaining that the screening test cannot be performed even in the semiconductor device in which the IGBT 200 and the snubber capacitor SC are mounted together, unless the semiconductor device is devised. In FIG. 5, snubber capacitor SC is connected in parallel between a collector C and a sources E of the IGBT 200. At this time, in a screening test for testing whether the dielectric strength of the capacitor insulating film constituting the snubber capacitor SC is good, a pulse voltage is applied between the capacitor electrodes of the snubber capacitor SC. Then, in a state in which a pulse voltage is applied between the capacitor electrodes of the snubber capacitor SC, by measuring a pulse current flowing through the capacitor insulating film sandwiched between the capacitor electrodes, it is tested whether or not the dielectric strength of the capacitor insulating film constituting the snubber capacitor SC is good.

Figure 6:
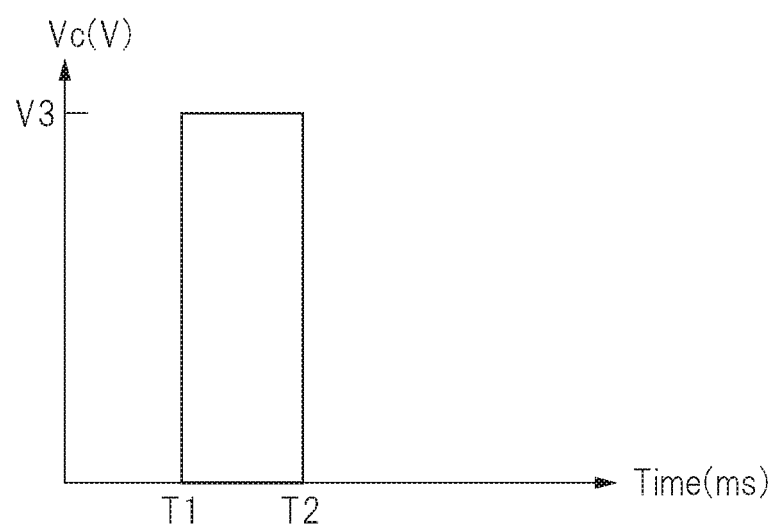
FIG. 6 is a diagram showing a pulse voltage applied between capacitor electrodes of a snubber capacitor.

Specifically, FIG. 6 is a diagram showing a pulse voltage applied between the capacitor electrodes of the snubber capacitor SC. For example, as shown in FIG. 6, in order to test the dielectric strength of the capacitor insulating film constituting the snubber capacitor SC, a voltage Vc is applied between the capacitor electrodes of the snubber capacitor SC. For example, in the screening test, it is required to apply a voltage V3 about four times the IGBT breakdown voltage between the capacitor electrodes of the snubber capacitor SC. However, the snubber capacitor SC is connected in parallel between the emitter E and the collector C of the IGBT 200. Therefore, in order to apply the voltage V3 between the capacitor electrodes of the snubber capacitor SC, the voltage V3 is applied between the emitter E and the collector C of the IGBT 200. At this time, in the IGBT 200, unlike the power MOSFET 100, the body diode BD is not formed parasitically, but when the screening test of the capacitor insulating film constituting the snubber capacitor SC is performed, the voltage V3 exceeding the withstand voltage is applied between the emitter E and the collector C of the IGBT 200. This means that the IGBT 200 is destroyed. As described above, in the semiconductor device in which the IGBT 200 and the snubber capacitor SC are mounted together, unless some contrivance is made, the semiconductor device cannot perform the screening test for testing the dielectric strength of the capacitor insulating film constituting the snubber capacitor SC.

A Basic Idea in the Embodiments

Therefore, in the present embodiment, in a semiconductor device including a snubber capacitor connected in parallel with a power transistor typified by a power MOSFET or an IGBT, a semiconductor device is devised to perform a screening test for testing the dielectric strength of a capacitor insulating film constituting the snubber capacitor. Hereinafter, the basic idea in the embodiment to which the present invention is applied will be described.

Figure 7:
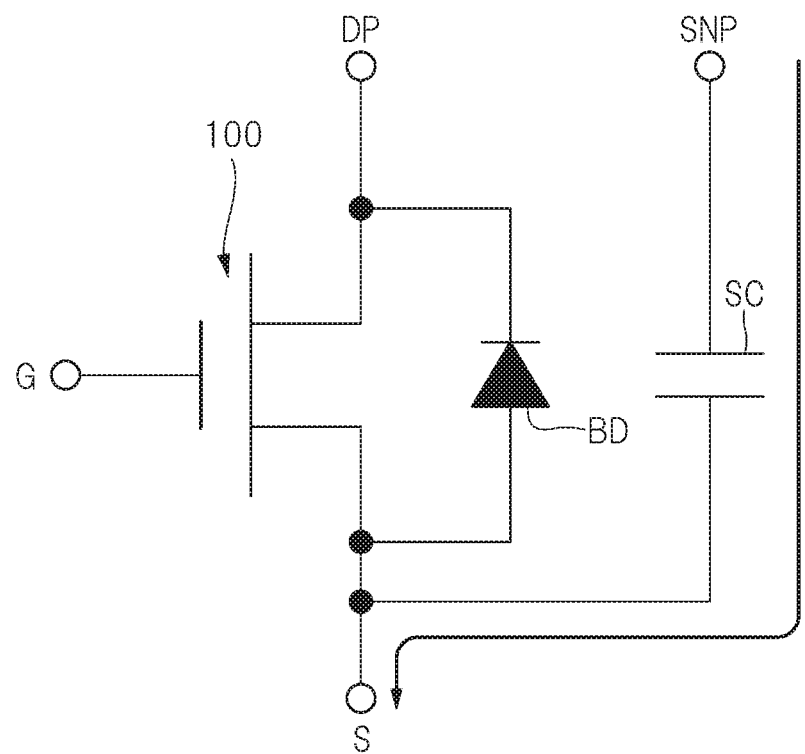
FIG. 7 is a circuit diagram schematically illustrating a circuit configuration of a semiconductor device in a screening step for performing a screening test.

FIG. 7 is a circuit diagram schematically showing a circuit configuration of a semiconductor device in a screening step of performing a screening test. As shown in FIG. 7, the power MOSFET 100 has gate electrodes G, a source S, and a drain, and the drain of the power MOSFET is electrically connected to the drain pads. In the power MOSFET 100 configured as described above, the body diode BD is parasitically formed between the source S and the drain. One of the capacitor electrodes of the snubber capacitor SC is electrically connected to the source S of the power MOSFET 100, and the other capacitor electrode of the snubber capacitor SC is electrically connected to the snubber capacitor pad SNP. At this time, in the screening step of performing the screening test, as shown in FIG. 7, the drain pad DP and the snubber capacitor pad SNP are not electrically connected to each other. That is, in the screening process, the power MOSFET 100 and the snubber capacitor SC are not connected in parallel. In this condition, pulsed voltages are applied between the snubber capacitor pad SNP and the sources S of the powers MOSFET. Here, in the present embodiment, since the drain pad DP and the snubber capacitor pad SNP are not electrically connected to each other, a pulsed voltage exceeding the withstand voltage of the power MOSFET 100 itself is not applied to the power MOSFET 100 itself. Therefore, even if the screening test is performed, the power MOSFET 100 is not destroyed. Further, since the pulse voltage is not applied to the body diode BD, it is possible to prevent the intended pulse voltage from not being applied to the snubber capacitor SC due to the clamp of the body diode BD. As described above, the basic idea of the present embodiment is to provide the snubber capacitor pad SNP which is not electrically connected to the drain of the power MOSFET 100, so that the prescribed pulse voltage is applied to the snubber capacitor SC while the pulse voltage is not applied between the source S and the drain of the power MOSFET 100 when the screening test is performed. As a result, according to the present embodiment, it is possible to reliably perform a screening test for testing the dielectric strength of the capacitor insulating film constituting the snubber capacitor SC, without preventing the breakdown of the power MOSFET 100 and without hindering the presence of the body diode BD.

However, in the final semiconductor device, since the power MOSFET 100 and the snubber capacitor SC need to be connected in parallel, the drain pad DP of the power MOSFET 100 and the snubber capacitor pad SNP of the snubber capacitor SC need to be electrically connected after the screening test is performed.

Figure 8:
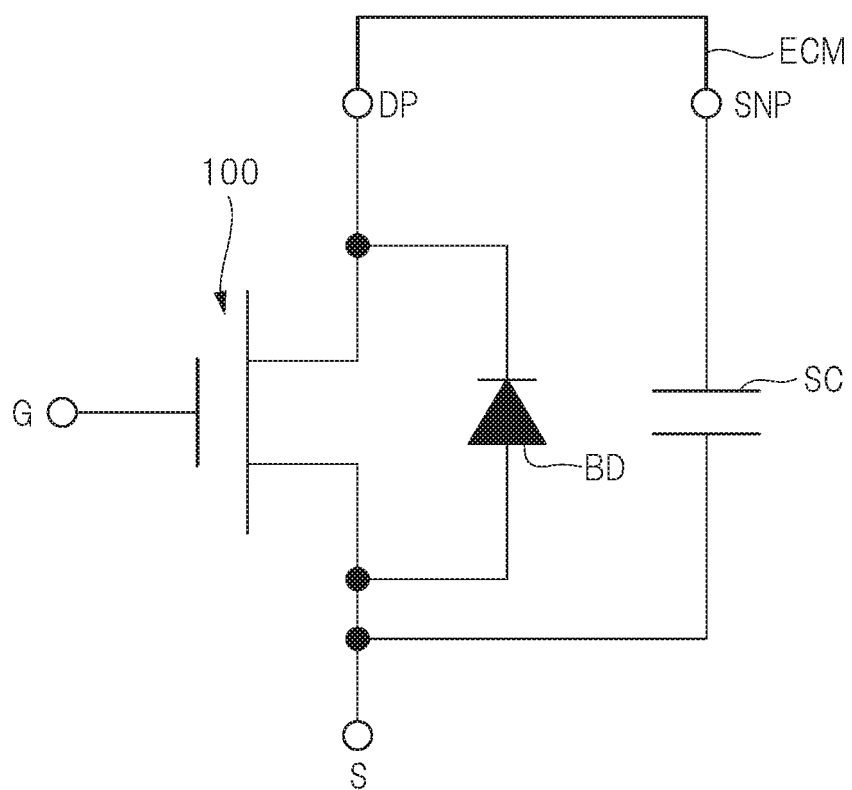
FIG. 8 is a circuit diagram schematically illustrating the circuit configuration of a semiconductor device in an assembly process after a screening test has been performed.

FIG. 8 is a circuit diagram schematically showing a circuit configuration of a semiconductor device in an assembling process after performing, for example, a screening test. As shown in FIG. 8, the drain pad DP of the power MOSFET 100 and the snubber capacitor pad SNP of the snubber capacitor SC are electrically connected to each other by an external connecting member ECM, for example. As a result, in the semiconductor device according to the present embodiment, the power MOSFET 100 and the snubber capacitor SC can be connected in parallel after the screening test is performed.

The basic idea in the present embodiment is devised in consideration of the fact that it is difficult to test the dielectric strength of the capacitor insulating film constituting the snubber capacitor SC when the power MOSFET 100 and the snubber capacitor SC are connected in parallel. Specifically, the basic idea in the present embodiment is that the drain pad DP of the power MOSFET 100 and the snubber capacitor pad SNP of the snubber capacitor SC are not electrically connected to each other in the stage of testing the dielectric strength of the capacitor insulating film constituting the snubber capacitor SC, while the drain pad DP and the snubber capacitor pad SNP are electrically connected to each other in the stage after the screening test is performed. Thus, according to the present embodiment, the dielectric strength of the capacitor insulating film constituting the snubber capacitor SC can be reliably tested, and the power MOSFET 100 and the snubber capacitor SC can be connected in parallel. As a result, it is possible to suppress the generation of a large back electromotive force (surge voltage) in the semiconductor device while improving the yield of the semiconductor device including the power MOSFET 100 and the snubber capacitor SC due to the fact that the screening test can be performed, and it is possible to reduce the component mounting area and the number of components on the mounting board for mounting the semiconductor device, as compared with the configuration in which the snubber capacitor is externally mounted.

A Configuration of a Semiconductor Device

Figure 9:
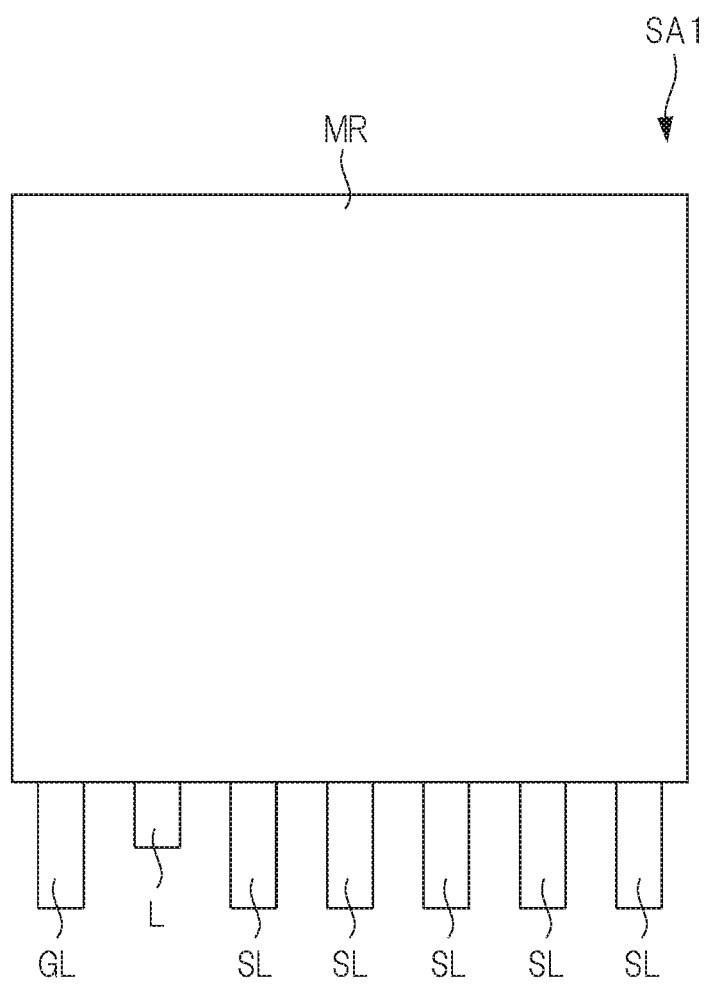
FIG. 9 is a diagram showing an external configuration of a semiconductor device according to an embodiment.

Next, a configuration of a semiconductor device in this embodiment be described. FIG. 9 is a diagram showing an external configuration of the semiconductor device SA1 according to the present embodiment. In FIG. 9, the semiconductor device SA1 in the present embodiment has a sealing body MR having a substantially rectangular planar shape, and a gate lead GL, a lead L, and a source lead SL protrude from the sealing body MR.

Figure 10:
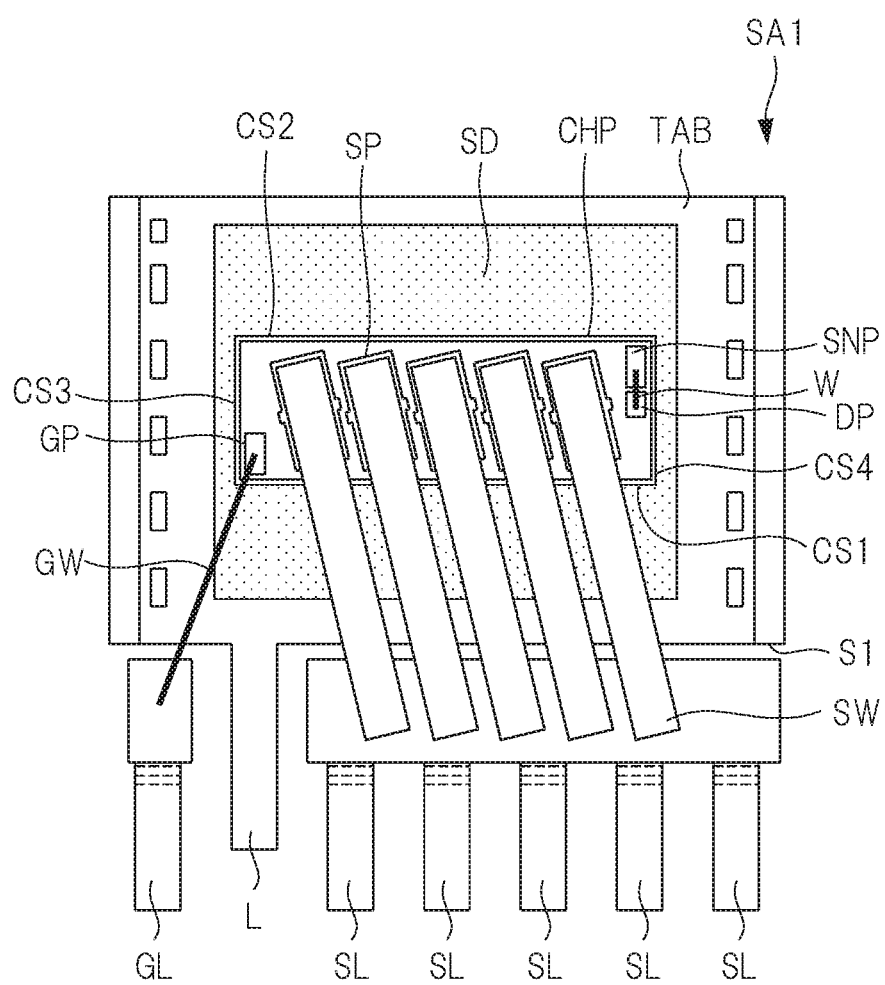
FIG. 10 is a diagram showing an internal structure of a semiconductor device according to an embodiment.

Next, FIG. 10 is a diagram showing the internal structure of the semiconductor device SA1 in the present embodiment. In FIG. 10, a semiconductor device SA1 according to the present embodiment includes a chip mounting portion TAB having a side S1, a semiconductor chip CHP mounted on the chip mounting portion TAB via a solder material SD, and a plurality of leads arranged to face each other with a distance from the side S 1 of the chip mounting portion TAB. At this time, the plurality of leads include a gate lead GL, a source lead SL, and a lead L integrally formed with the chip mounting portion TAB.

In the semiconductor chip CHP, a power MOSFET, which is a type of power transistor, and a snubber capacitor connected in parallel with the power MOSFET are formed in the semiconductor chip CHP. The power MOSFET includes a gate electrode electrically connected to the gate lead GL, a source region electrically connected to the source lead SL, and a drain region electrically connected to the chip mounting portion TAB. On the other hand, the snubber capacitor includes a first capacitor electrode electrically connected to the source region, a second capacitor electrode disposed to face the first capacitor electrode apart from the first capacitor electrode, and a capacitor insulating film sandwiched between the first capacitor electrode and the second capacitor electrode.

As shown in FIG. 10, the semiconductor chip CHP has a substantially rectangular planar shape. More specifically, the semiconductor chip CHP has a chip side CS1 arranged to face the side S1 of the chip mounting portion TAB, a chip side CS2 located on the opposite side of the chip side CS1, a chip side CS3 crossing the chip side CS1 and the chip side CS2, and a chip side CS4 crossing the chip side CS1 and the chip side CS2 and located on the opposite side of the chip side CS3.

A plurality of source pads SP electrically connected to the source regions of the power MOSFET are formed on the surface of the semiconductor chip CHP, and the plurality of source pads SP are electrically connected to the source leads SL by the source wires SW. Gate pads GP electrically connected to the gate electrodes of the power MOSFET are formed on the surfaces of the semiconductor chips CHP. The gate pad GP is electrically connected to the gate lead GL by a gate wire GW. Further, a snubber capacitor pad SNP electrically connected to the second capacitor electrode of the snubber capacitor is formed on the surface of the semiconductor chip CHP. Drain pads DP electrically connected to the drain regions of the power MOSFET are also formed on the surfaces of the semiconductor chips CHP. At this time, as shown in FIG. 10, the snubber capacitor pad SNP and the drain pad DP are electrically connected by a wire W.

Here, as shown in FIG. 10, the diameter of the gate wire GW is smaller than the diameter of the source wire SW. Similarly, the diameter of the wire W is smaller than the diameter of the source wire SW. On the other hand, the diameter of the wire W and the diameter of the gate wire GW are equal to each other.

Figure 11:
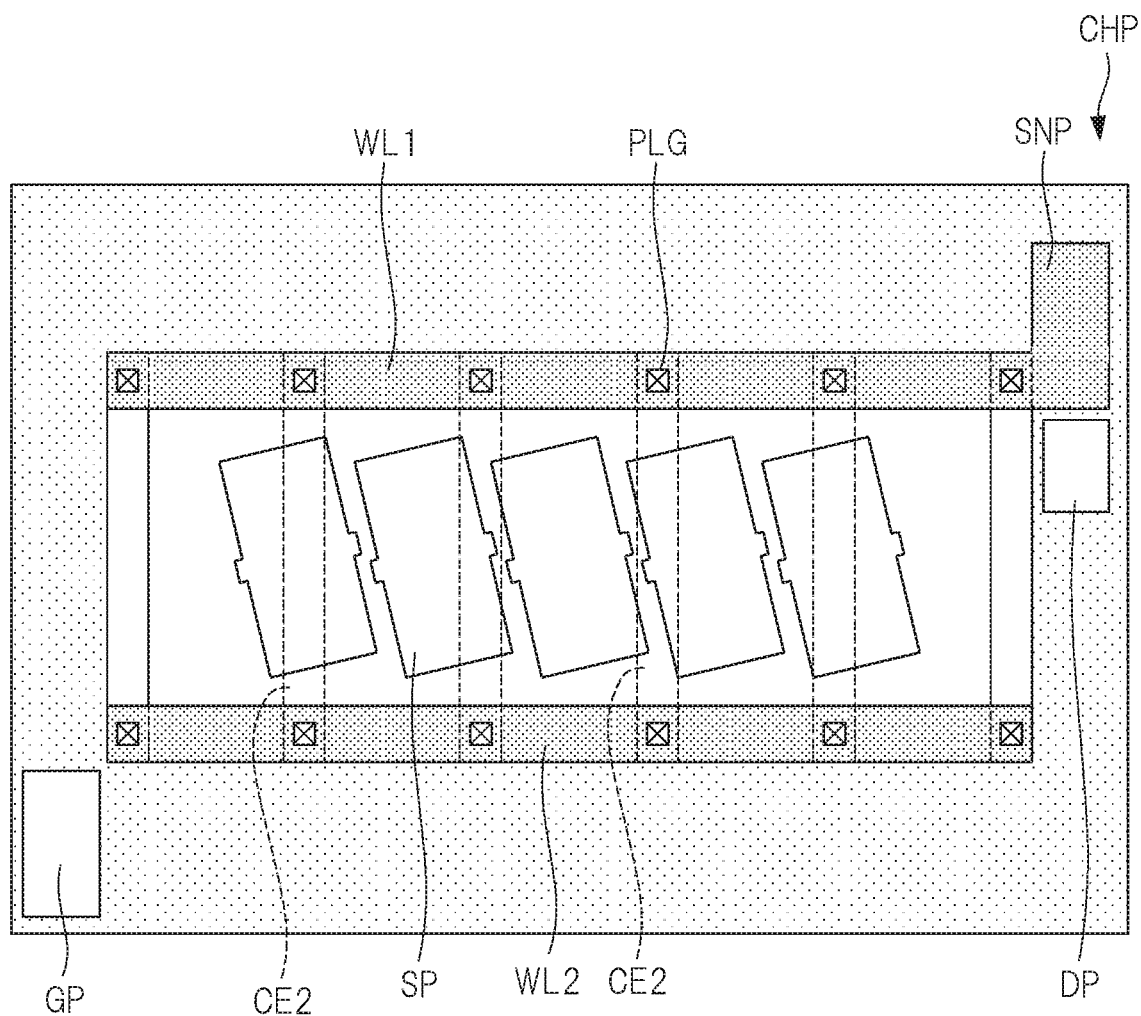
FIG. 11 is a diagram showing a schematic layout configuration for connecting a second capacitor electrode, which is a component of a snubber capacitor, and a snubber capacitor pad in the semiconductor chip of the embodiment.

Next, FIG. 11 is a diagram showing a schematic layout configuration for connecting the second capacitor electrode, which is a component of the snubber capacitor, and the snubber capacitor pad in the semiconductor chip CHP of the present embodiment. In FIG. 11, a plurality of capacitor electrodes CE2 are arranged below the source pads SP formed on the surface of the semiconductor chip CHP. The plurality of capacitor electrodes CE2 are connected to the wiring WL1 and the wiring WL2 in the upper layer by the plug PLG. As a result, the plurality of capacitor electrodes CE2 are electrically connected to the snubber capacitor pad SNP formed on the surface of the semiconductor chip CHP by the wiring WL 1 and the wiring WL2.

Figure 12:
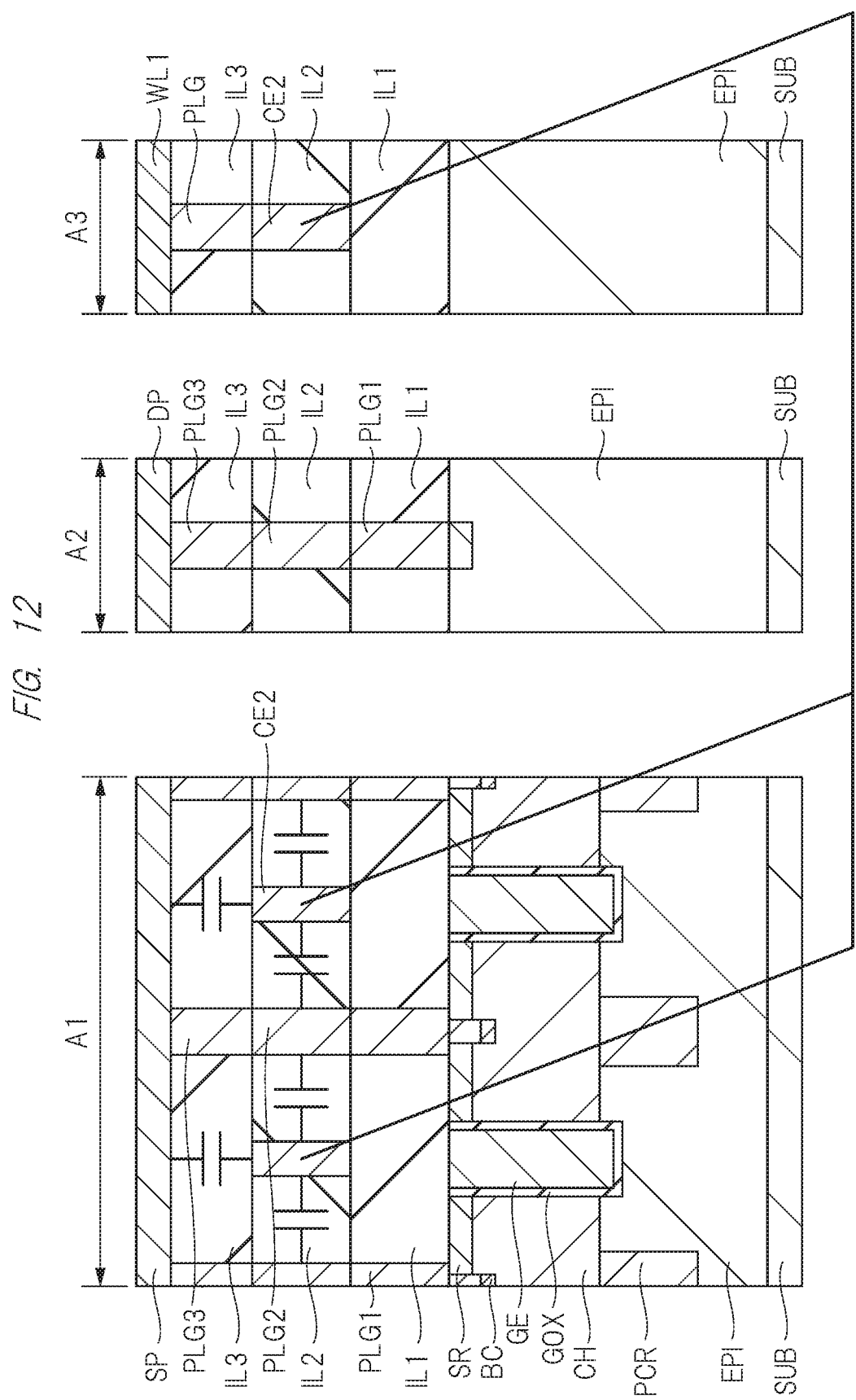
FIG. 12 is a cross-sectional view of a semiconductor chip in an embodiment.

Next, FIG. 12 is a cross-sectional view of the semiconductor chip CHP in the present embodiment. FIG. 12 shows a cross-sectional structure in the power MOSFET forming region A1, a cross-sectional structure in the drain pad forming region A2, and a cross-sectional structure in the wiring forming region A3 in which the wiring WL1 connected to the snubber capacitor pad is formed.

First, cross-sectional structures in the power MOSFET forming area A1 will be described. In the power MOSFET forming region A1 of FIG. 12, an epitaxial layer (n-type semiconductor layer) EPI is formed on the semiconductor substrate (n-type substrate) SUB, and in the epitaxial layer EPI, a channel region (p-type semiconductor region) CH and p-type columns PCR are formed to form a so-called super junction structure. At this time, the semiconductor substrate SUB and the epitaxial layer EPI function as drain regions of the power MOSFET.

For example, in a power MOSFET having a super junction structure, a depletion layer extends laterally from a p-n junction formed at a border region between the p-type column region PCR and the epitaxial layer EPI when the p-type column region PCR and the epitaxial layer EPI are off. Therefore, in the power MOSFET having the super junction structure, even if the impurity concentration of the epitaxial layer EPI serving as the current path is increased, the depletion layer extending inward of the epitaxial layer EPI sandwiched between the two border regions is connected, and the entire epitaxial layer EPI is easily depleted.

As a result, the entire epitaxial layer EPI is depleted in the OFF state, so that the withstand voltage can be secured. That is, in the power MOSFET having the super junction structure, the entire epitaxial layer EPI can be depleted while increasing the impurity concentration of the epitaxial layer EPI which is a current path. As a result, the power MOSFET having the super junction structure can reduce the on-resistance while ensuring a high breakdown voltage.

A trench is formed so as to penetrate the channel region CH and reach the epitaxial layer EPI, and a gate insulating film GOX made of, for example, a silicon oxide film is formed on the inner wall of the trench. Further, a gate electrode GE made of, for example, a polysilicon film is formed so as to bury the inside of the trench with the gate insulating film GOX interposed therebetween. On the other hand, a source region (n-type semiconductor region) is formed on the surface of the channel region CH, and a body contact region (p-type semiconductor region) BC having an impurity concentration higher than that of the channel region CH is formed inside the channel region CH. In this manner, a power MOSFET is formed. That is, the power MOSFET includes the gate electrode GE, the epitaxial layer EPI and the semiconductor substrate SUB functioning as drain regions, and source regions SR. At this time, in the power MOSFET having the above-described configuration, the p-n junction diodes are parasitically formed by the epitaxial layer EPI, which is the n-type semiconductor layer, and the channel region CH, which is the p-type semiconductor region. This parasitically formed pn junction diode is called a body diode.

Subsequently, in the power MOSFET forming area A1 of FIG. 12, an interlayer insulating layer IL 1 made of, for example, a silicon oxide film is formed so as to cover the power MOSFET, and plug PLG1 penetrating the interlayer insulating layer IL1 are formed in the interlayer insulating layer IL1. The plug PLG1 is electrically connected to both the source region SR and the body contact region BC.

Therefore, in the power MOSFET shown in the power MOSFET forming region A1 of FIG. 12, the source region SR and the body contact region BC are electrically connected to each other. In other words, the source region SR is electrically connected to the channel region CH via the body contact region BC. Here, the body contact region BC has a function of ensuring ohmic contact with the plug PLG1, and the source region SR and the channel region CH are electrically connected to each other at the same potential due to the presence of the body contact region BC.

Therefore, it is possible to suppress the on operation of the parasitic npn bipolar transistor in which the source region SR is an emitter region, the channel region CH is a base region, and the epitaxial layer EPI is a collector region. That is, the fact that the source region SR and the channel region CH are electrically connected to each other at the same potential means that a potential difference does not occur between the emitter region and the base region of the parasitic npn bipolar transistor, whereby the on operation of the parasitic npn bipolar transistor can be suppressed.

Next, as shown in the power MOSFET forming area A1 of FIG. 12, an interlayer insulating layer IL 2 made of, for example, a silicon oxide film is formed on the interlayer insulating layer IL1 on which the plug PLG1 is formed. At this time, the inter-layer insulating layer IL2 is formed with a plug PLG2 that passes through the inter-layer insulating layer IL2 and is connected to the plug PLG1, and a capacitive electrode (second capacitive electrode) CE2 having a snubber capacity is formed. An interlayer insulating layer IL3 made of, for example, a silicon oxide film is formed on the interlayer insulating layer IL2. The interlayer insulating layer IL 3 is formed with a plug PLG3 that penetrates the interlayer insulating layer IL 3 and is connected to the plug PLG2. The source pad SP is formed on the interlayer insulating layer IL3 on which the plug PLG3 are formed. Therefore, the source regions SR and the source pad SP are electrically connected to each other through the plug PLG1, the plug PLG2, and the plug PLG3.

Here, as shown in FIG. 12, the snubber capacitor is mainly composed of the capacitor electrode CE2 formed on the interlayer insulating layer IL2, the capacitance between the capacitor electrode CE2 and the opposing plug PLG2, and the capacitance between the capacitor electrode CE2 and the source pad SP. That is, the snubber capacitor is composed of a capacitor electrode CE2 serving as a second capacitor electrode, a "plug PLG2+source pad SP" functioning as a first capacitor electrode, and a capacitor insulating film composed of "part of the interlayer insulating layer IL2+part of the interlayer insulating layer IL3" sandwiched between the first capacitor electrode and the second capacitor electrode.

In particular, in the device structure shown in the power MOSFET forming region A1 of FIG. 12, the capacitor electrode CE2 of the snubber capacitor is formed by effectively utilizing the space formed above the gate electrode GE. Therefore, the snubber capacitor can be mixed and mounted on the semiconductor chip on which the power MOSFET is formed without causing an increase in the size of the semiconductor chip.

Next, a cross-sectional structure of the drain pad formation region A2 will be described. In the drain pad formation region A2 of FIG. 12, an epitaxial layer (n-type semiconductor layer) EPI is formed on the semiconductor substrate (n-type substrate) SUB. An interlayer insulating layer IL 1 made of, for example, a silicon oxide film is formed on the epitaxial layer EPI. The interlayer insulating layer IL 1 is formed with plug PLG1 penetrating the interlayer insulating layer IL1. At this time, high-concentration n-type semiconductor regions having higher impurity concentrations than the epitaxial layer EPI are formed on the surfaces of the epitaxial layer EPI contacting the plug PLG1. The high-concentration n-type semiconductor region has a function of ensuring ohmic contacts between the plug PLG1 and the epitaxial layer EPI.

Next, as shown in the drain-pad forming area A2 of FIG. 12, an interlayer insulating layer IL2 made of, for example, a silicon-oxide film is formed on the interlayer insulating layer IL1 on which the plug PLG1 is formed. At this time, a plug PLG2 penetrating the interlayer insulating layer IL2 and connected to the plug PLG1 is formed in the interlayer insulating layer IL2. An interlayer insulating layer IL3 made of, for example, a silicon oxide film is formed on the interlayer insulating layer IL2. The interlayer insulating layer IL3 is formed with a plug PLG3 that penetrates the interlayer insulating layer IL3 and is connected to the plug PLG2. Further, drain pads DPs are formed on the interlayer insulating layer IL3 on which the plug PLG3 is formed. Therefore, the epitaxial layer EPI and the drain pad DP are electrically connected to each other via the plug PLG1, the plug PLG2, and the plug PLG3. Since the semiconductor substrate SUB and the epitaxial layer EPI are the drain regions of the power MOSFET, the drain pads DP formed on the surfaces of the semiconductor chips are electrically connected to the drain regions of the power MOSFET.

Next, a cross-sectional structure in the wiring formation region A3 in which the wiring WL1 connected to the snubber capacitor pad is formed will be described. In the wiring formation region A3 of FIG. 12, an epitaxial layer (n-type semiconductor layer) EPI is formed on the semiconductor substrate (n-type substrate) SUB. An interlayer insulating layer IL1 made of, for example, a silicon oxide film is formed on the epitaxial layer EPI. As shown in the wiring formation region A3 of FIG. 12, an interlayer insulating layer IL2 made of, for example, a silicon oxide film is formed on the interlayer insulating layer IL1. At this time, a capacitor electrode CE2 penetrating the interlayer insulating layer IL2 is formed in the interlayer insulating layer IL2. An interlayer insulating layer IL3 made of, for example, a silicon oxide film is formed on the interlayer insulating layer IL2. The interlayer insulating layer IL3 is formed with a plug PLG that penetrates the interlayer insulating layer IL3 and is connected to the capacitor electrode CE2. Further, a wiring WL1 is formed on the interlayer insulating layer IL3 on which the plug PLG is formed. At this time, for example, as shown in FIG. 11, the wiring WL1 is electrically connected to the snubber capacitor pad SNP. Therefore, the capacitor electrode CE2 shown in the wiring formation region A3 of FIG. 12 is electrically connected to the snubber capacitor pad SNP via the plug PLG and the wiring WL1. As shown in FIG. 10, in the semiconductor device SA1 according to the present embodiment, the snubber capacitor pad SNP and the drain pad DP are connected by a wire W. As shown in the drain pad forming region A2 of FIG. 12, since the drain pad DP is electrically connected to the drain region ("epitaxial layer EPI+semiconductor substrate SUB") of the power MOSFET, the capacitor electrodes CE2 are electrically connected to the drain region of the power MOSFET. On the other hand, as shown in the power MOSFET forming region A1 of FIG. 12, the "plug PLG2+source pad SP" functioning as the first capacitor electrode facing the capacitor electrode (second capacitor electrode) CE2 is electrically connected to the source region SR of the power MOSFET. Therefore, the snubber capacitor composed of the capacitor electrode (second capacitor electrode) CE2 and the first capacitor electrode ("plug PLG2+source pad SP") is connected in parallel between the source region SR and the drain region of the power MOSFET.

A Manufacturing Method of a Semiconductor Device

The semiconductor device SA1 in the present embodiment is configured as described above, and the manufacturing method thereof will be described below with reference to the drawings.

Figure 13:
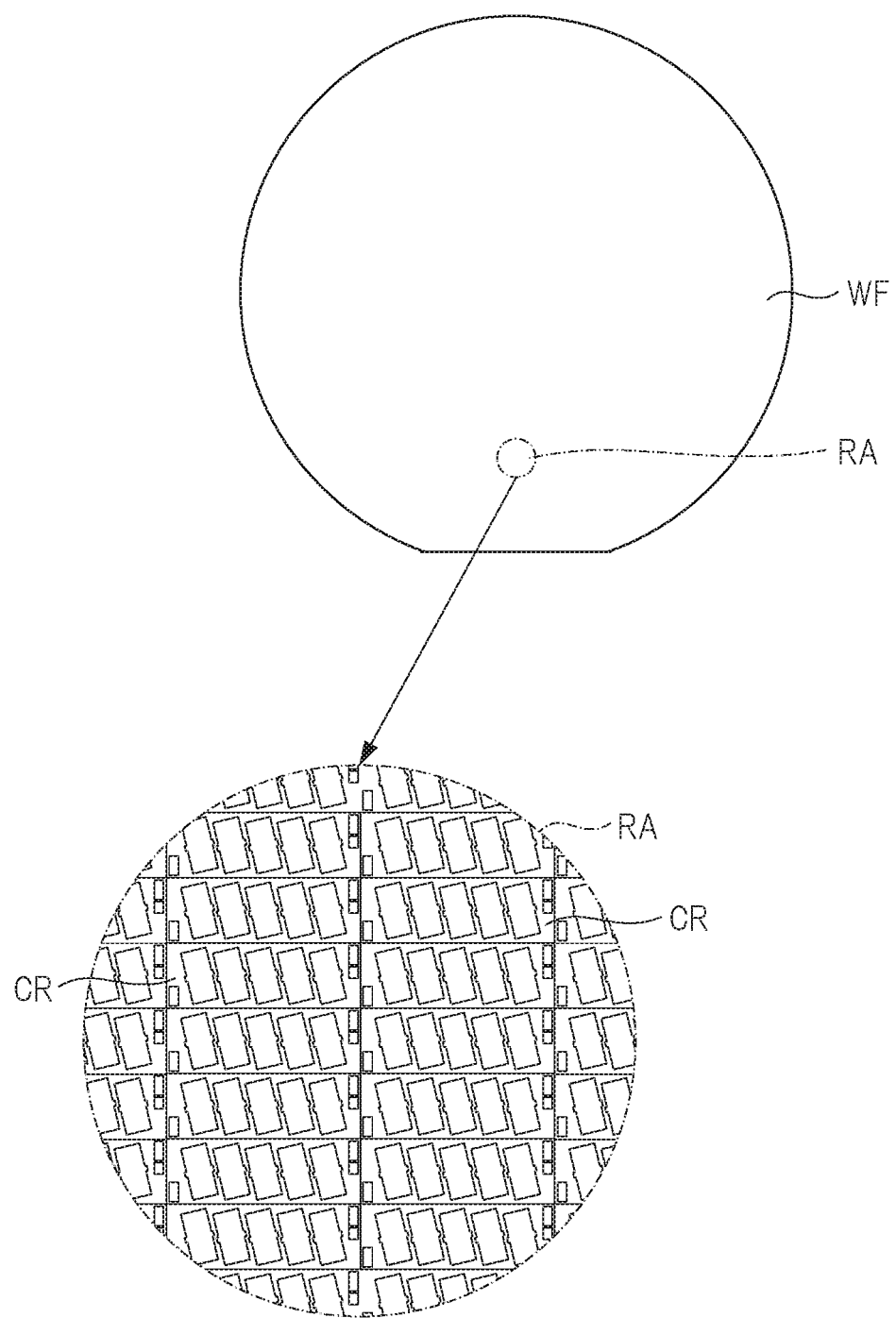
FIG. 13 is a diagram schematically showing a semiconductor wafer.

First, FIG. 13 is a diagram schematically showing the semiconductor wafer WF, and also shows an enlarged view of the region RA of the semiconductor wafer WF. As shown in the enlarged view of the region RA in FIG. 13, a plurality of chip regions CR are formed in the semiconductor wafer WF.

In each of the plurality of chip regions CR, a power transistor and a snubber capacitor electrically connected to the power transistor are formed. Here, the power transistor has a source region (first region), a drain region (second region), and a gate electrode for controlling a current flowing between the source region and the drain region. The snubber capacitor includes a first capacitor electrode electrically connected to the source region, and a second capacitor electrode disposed to face the first capacitor electrode apart from the first capacitor electrode. At this time, a snubber capacitor pad electrically connected to the second capacitor electrode of the snubber capacitor, a source pad electrically connected to the source region, a drain pad electrically connected to the drain region, and a gate pad electrically connected to the gate electrode are formed on the surface of each of the plurality of chip regions.

After the semiconductor wafer having the above-described structure is prepared, the dielectric strength of the capacitor insulating film sandwiched between the first capacitor electrode and the second capacitor electrode is tested for the snubber capacitor formed in each of the plurality of chip regions CR.

Figure 14:
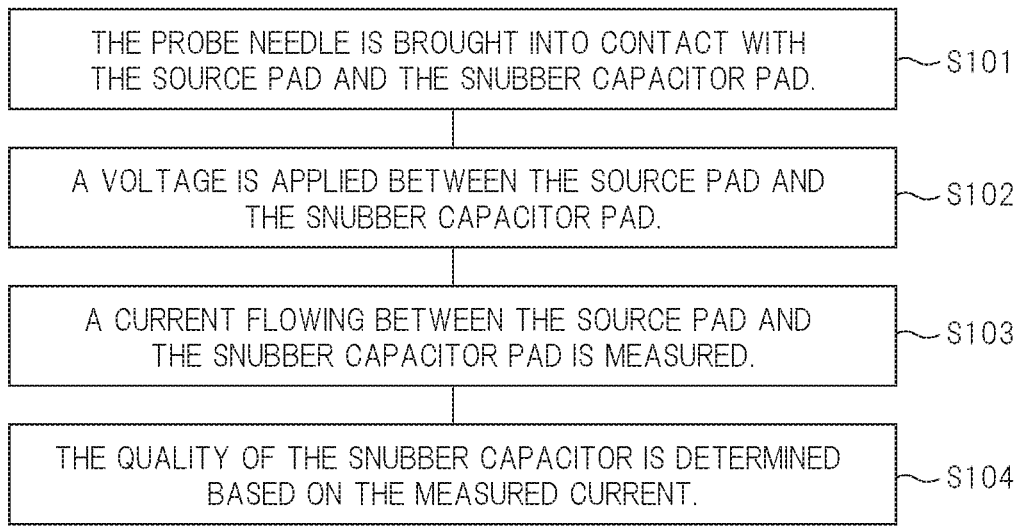
FIG. 14 is a flow chart showing the flow of the screening test.
Figure 15:
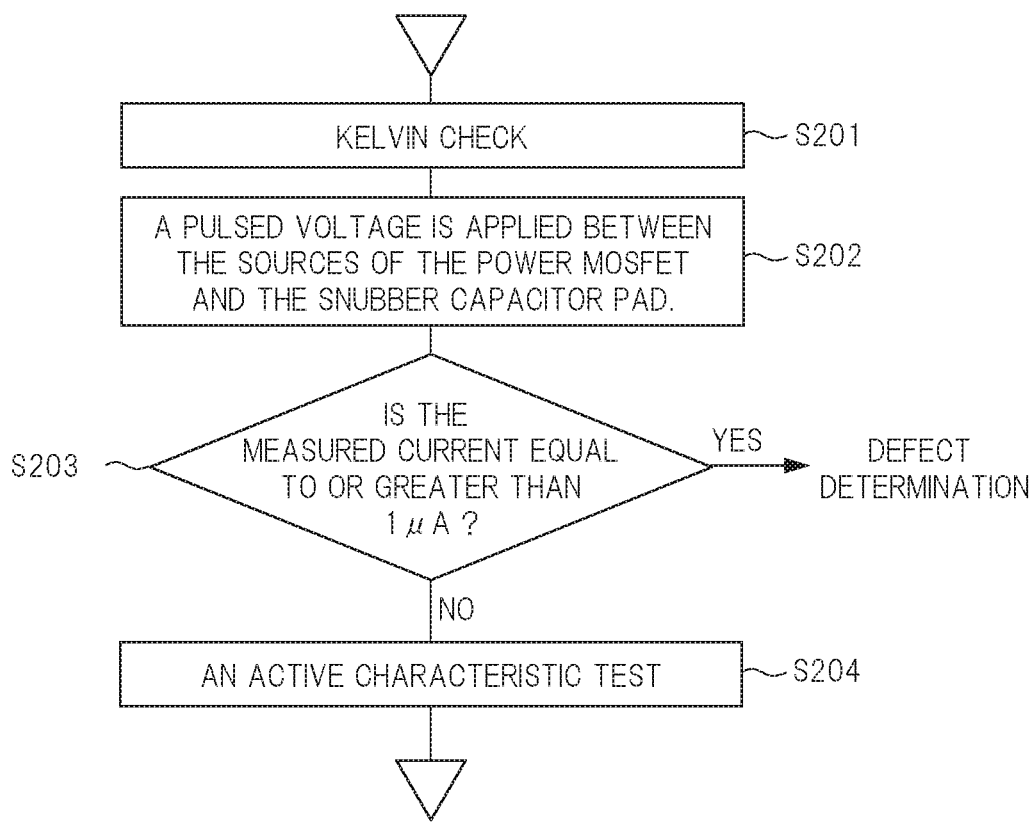
FIG. 15 is a flow chart illustrating an example of a screening test.

FIG. 14 is a flowchart showing the flow of the screening test. In FIG. 14, first, in step S101, the probe needle is brought into contact with the source pad and the snubber capacitor pad. Next, in step S102, a voltage is applied between the source pad and the snubber capacitor pad. Next, in step S103, a current flowing between the source pad and the snubber capacitor pad is measured. Thereafter, the quality of the snubber capacitor is determined based on the measured current in step S104. FIG. 15 is a flowchart showing a specific example of the screening test. In FIG. 15, first, after the probe needle is brought into contact with the snubber capacitor pad, it is confirmed whether or not the probe needle is in contact with the snubber capacitor pad. Specifically, since the snubber capacitor is a capacitor, it is open in terms of direct current, and therefore it is checked in "Kelvin check" whether or not the probe needle is in contact with the snubber capacitor pad (S201). Next, in step S202, a pulsed voltage is applied between the sources of the power MOSFET and the snubber capacitor pad. Next, the current flowing between the sources of the power MOSFET and the snubber capacitor pad is measured, and when the measured current is equal to or greater than a specified value (e.g., 1 µA), it is determined that the dielectric strength of the snubber capacitor is poor (S203). On the other hand, when the measured current is less than the specified value, it is determined that the snubber capacitor has good dielectric strength in step S203. Thereafter, an active characteristic test, which is a test of the characteristic assurance item, is performed in step S204. As described above, the screening test of the snubber capacity is performed.

Next, by dicing the semiconductor wafer WF, a plurality of chip regions CR are singulated to obtain semiconductor chips. At this time, the semiconductor chip on which the snubber capacitor having passed the screening test is formed is extracted as a non-defective product.

Figure 16:
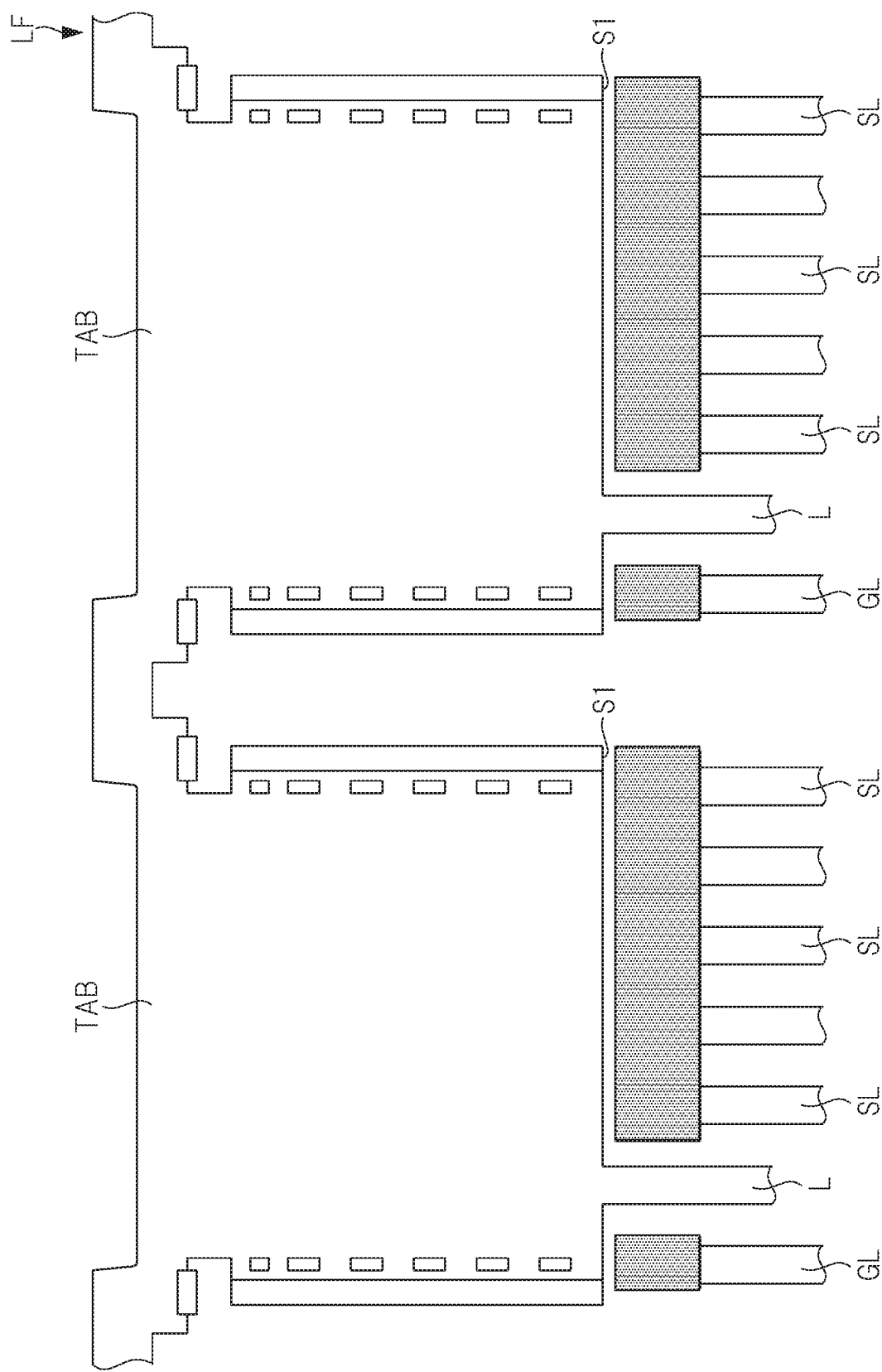
FIG. 16 is a cross-sectional view illustrating a process of manufacturing a semiconductor device according to an embodiment.

Next, as shown in FIG. 16, a lead frame LF is prepared which includes a chip mounting portion TAB having a side S1 and a plurality of leads arranged to face each other and separated from the side S1 of the chip mounting portion TAB. Here, the plurality of leads include a gate lead GL, a source lead SL, and a lead L integrally formed with the chip mounting portion TAB. Then, a plating film made of nickel is formed at the post of the gate lead GL and the post of the source lead SL (see dot region of FIG. 16).

Figure 17:
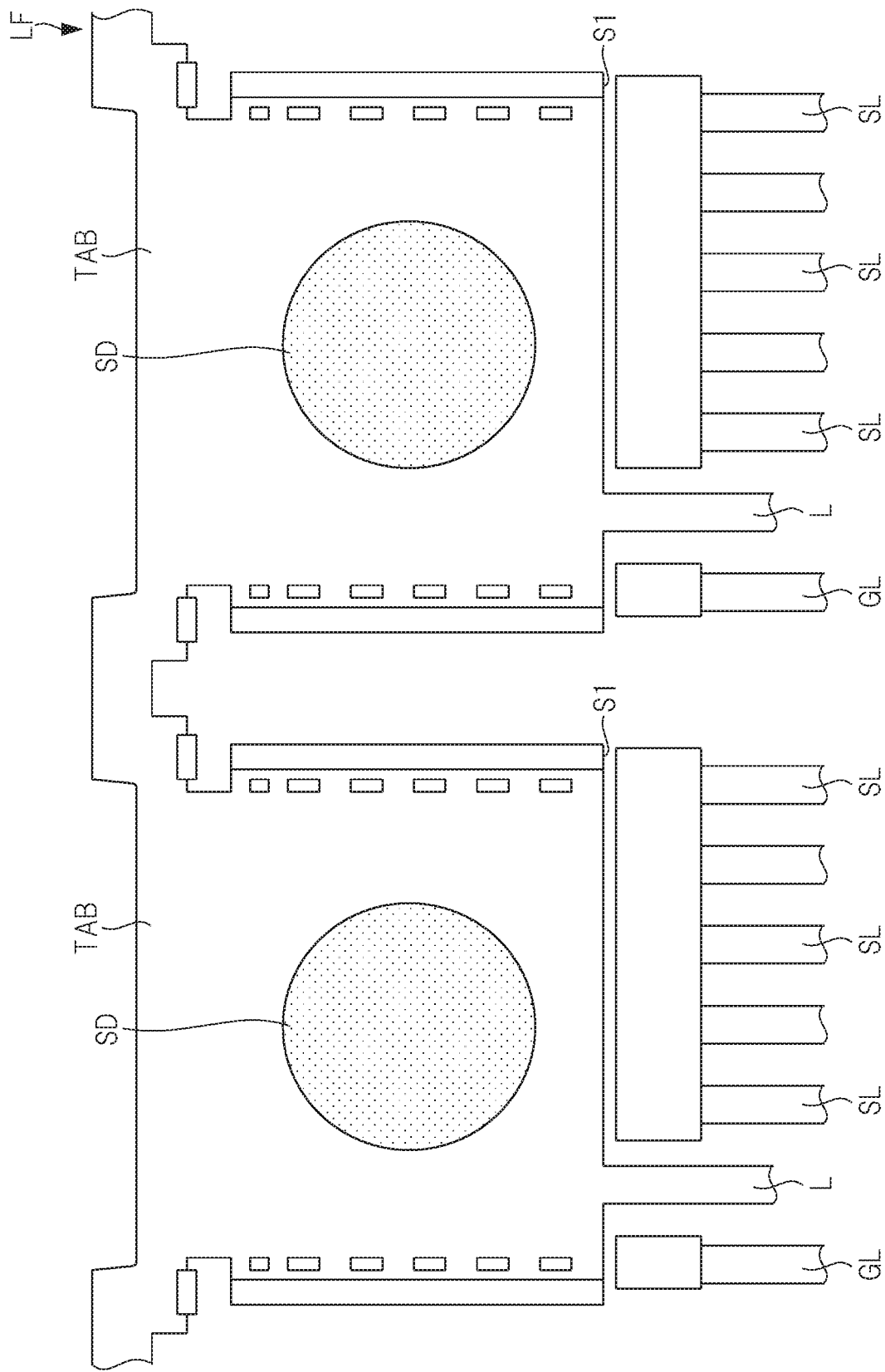
FIG. 17 is a cross-sectional view illustrating a process of manufacturing a semiconductor device following FIG. 16.
Figure 18:
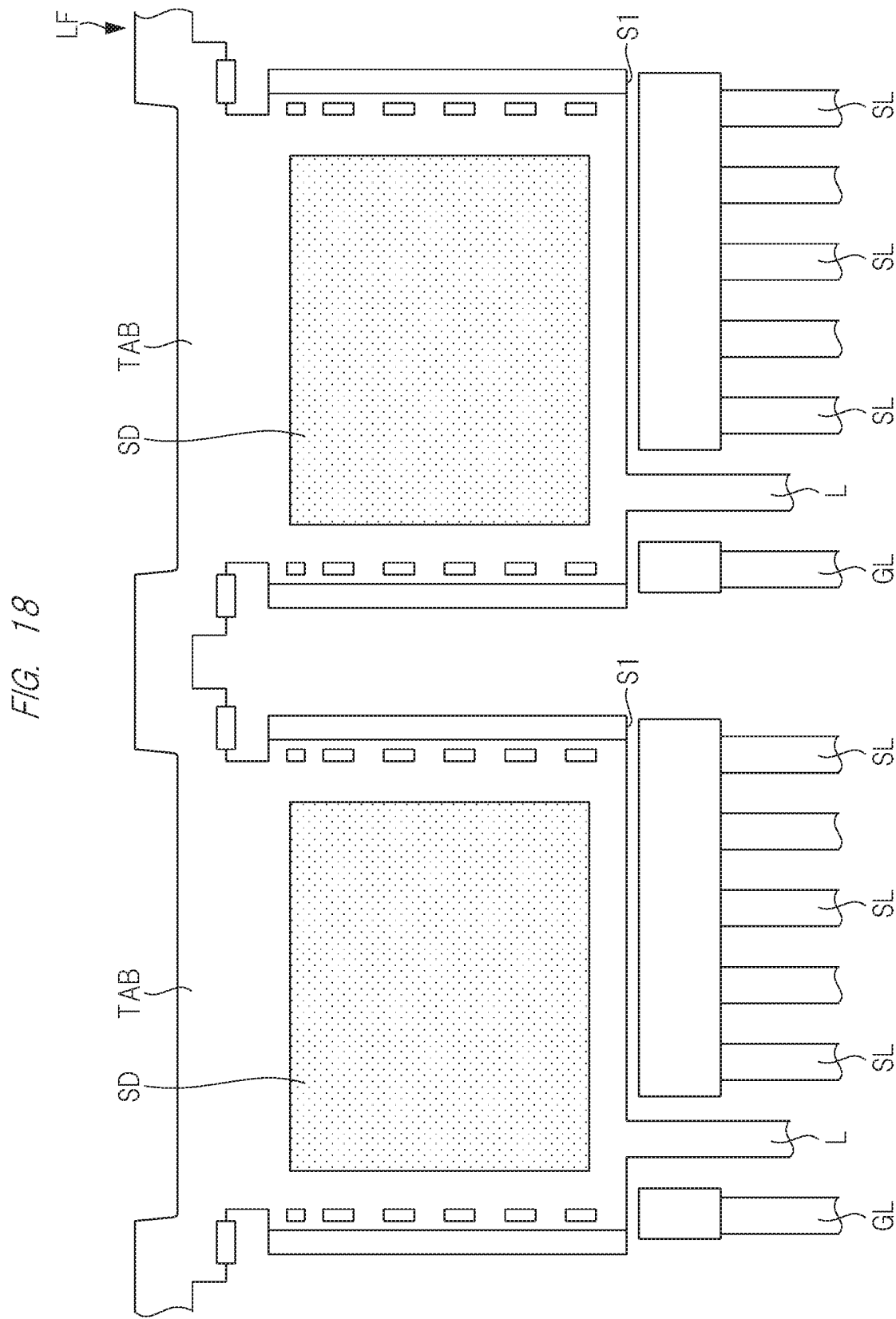
FIG. 18 is a cross-sectional view illustrating a process of manufacturing a semiconductor device following FIG. 17.

Thereafter, as shown in FIG. 17, solder SD is supplied onto the chip mounting portion TAB. Then, as shown in FIG. 18, the solder SD supplied onto the chip mounting portion TAB is extended.

Figure 19:
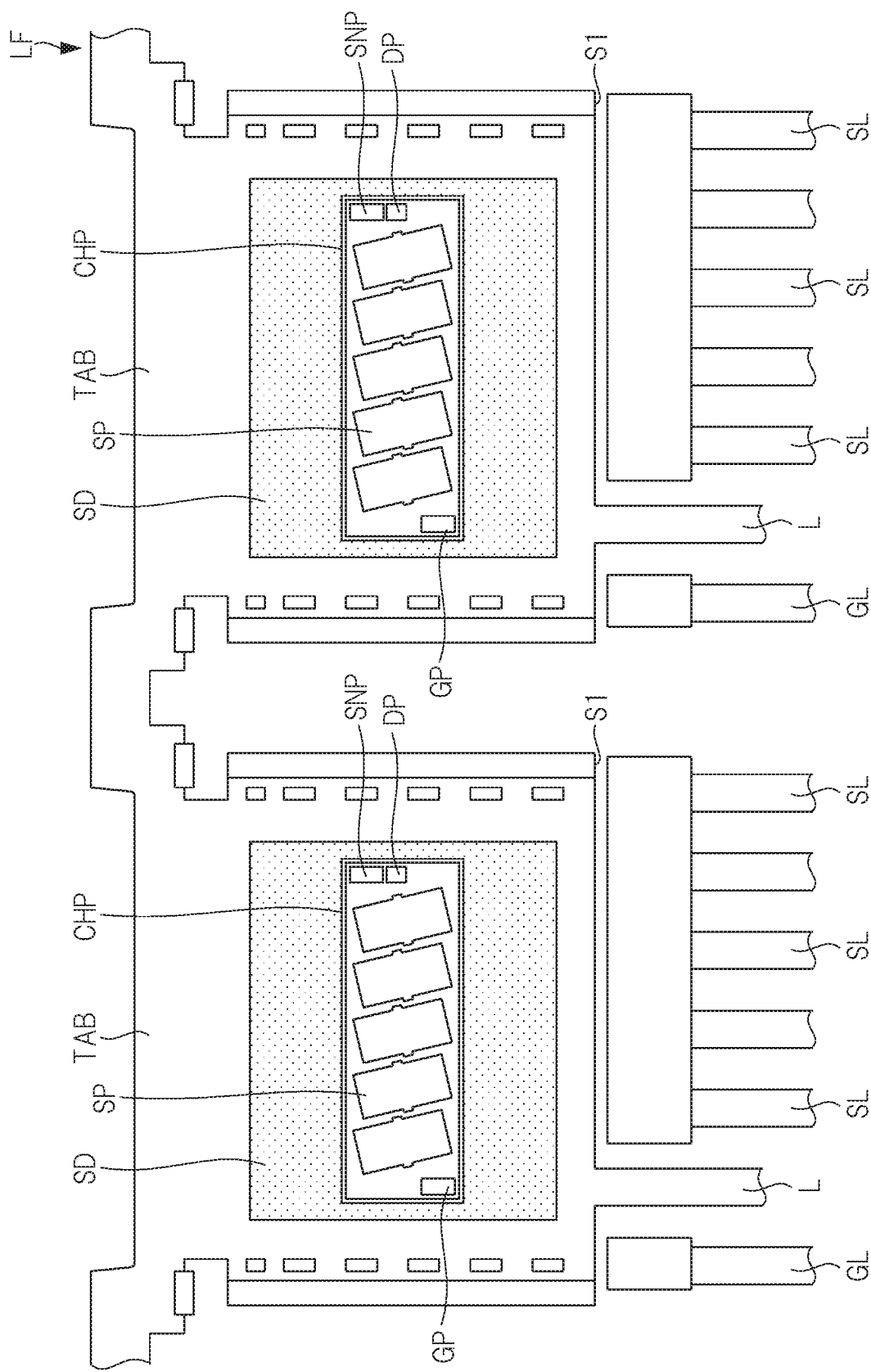
FIG. 19 is a cross-sectional view illustrating a process of manufacturing a semiconductor device following FIG. 18.

Next, as shown in FIG. 19, the semiconductor chip CHP on which the snubber capacitor having passed the screening test is formed is mounted on the chip mounting portion TAB via the solder SD. At this time, a snubber capacitor pad SNP, a source pad SP, a drain pad DP, and a gate pad GP are formed on the surface of the semiconductor chip CHP.

Figure 20:
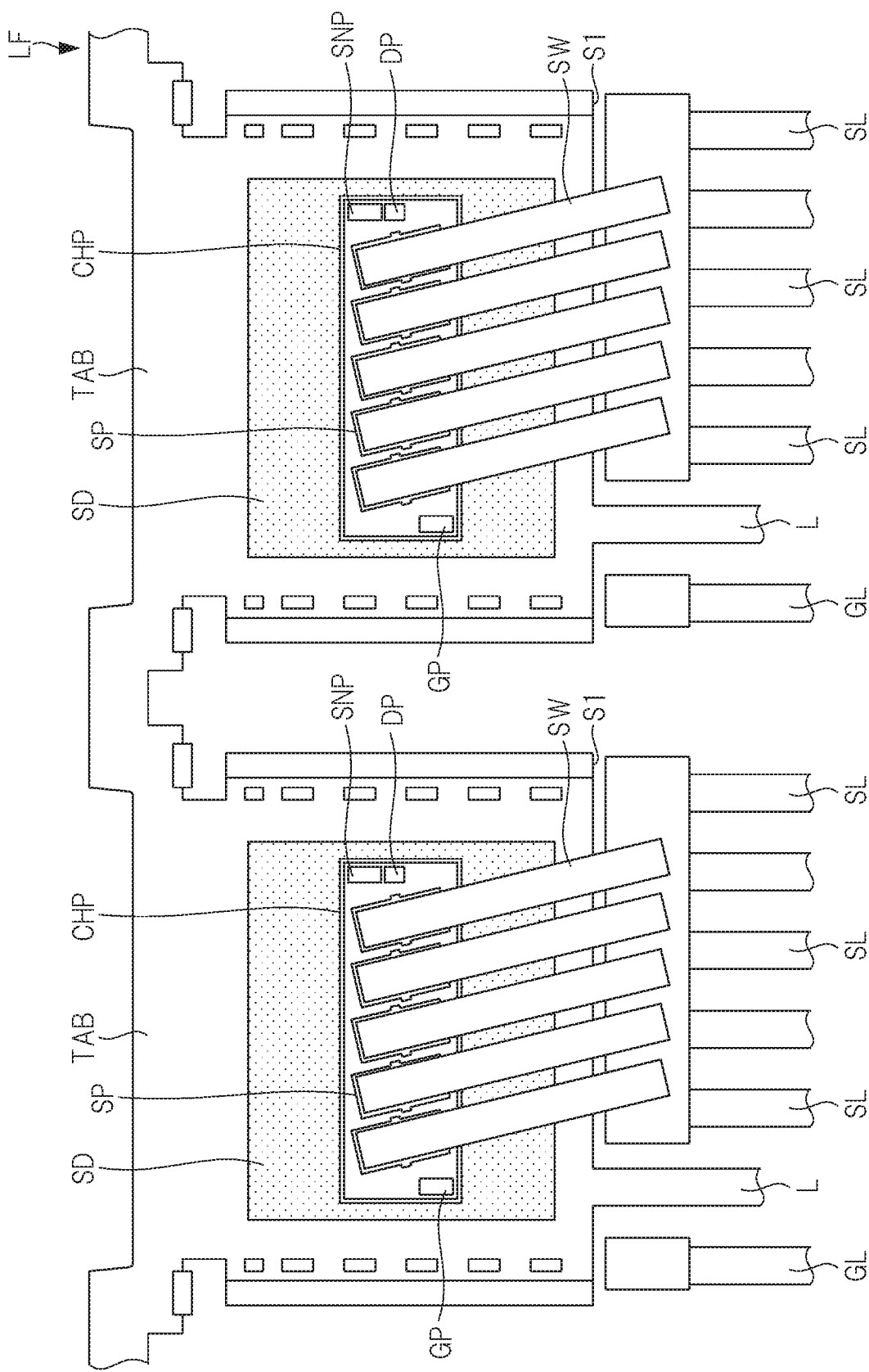
FIG. 20 is a cross-sectional view illustrating a process of manufacturing a semiconductor device following FIG. 19.
Figure 21:
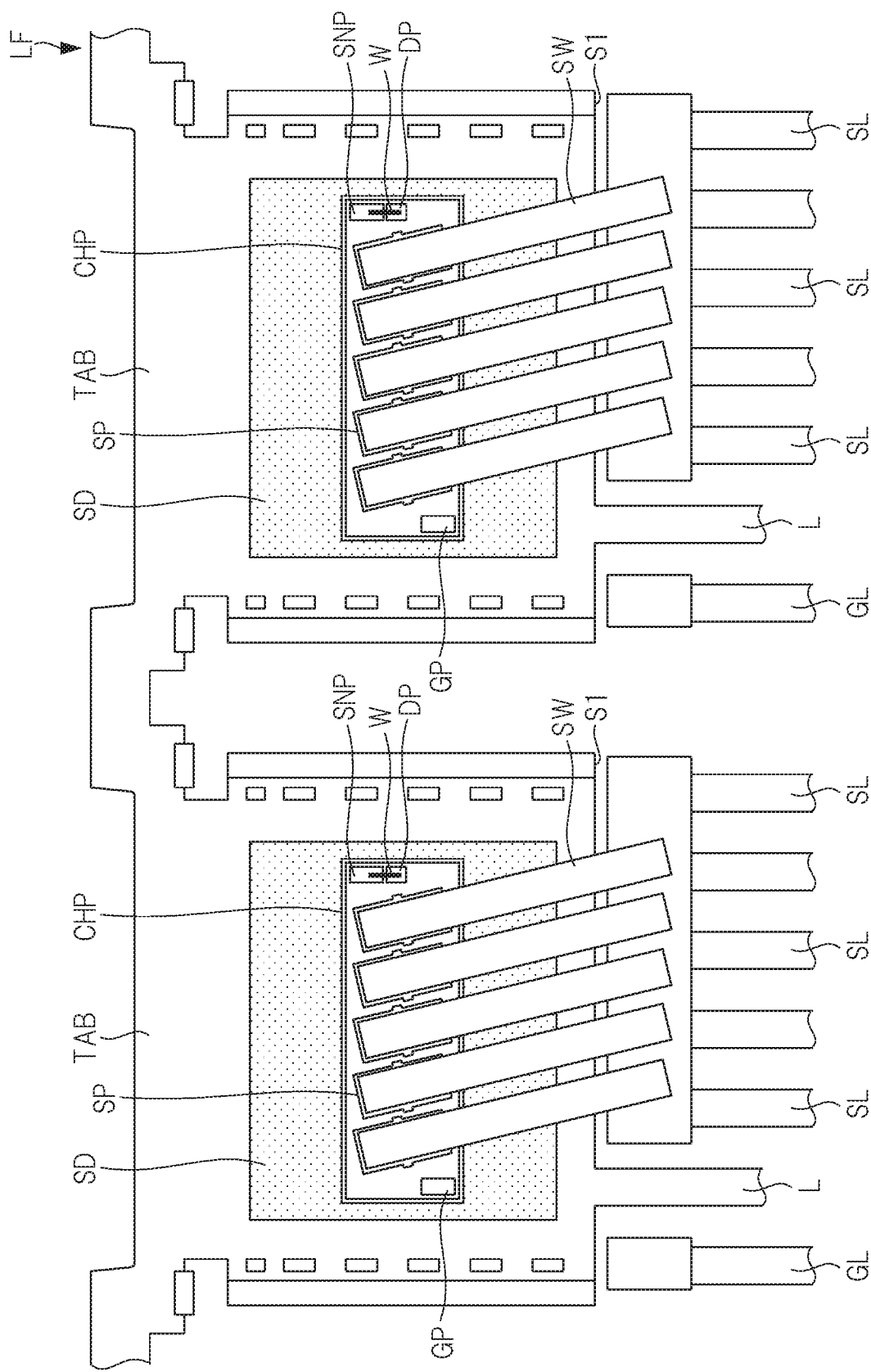
FIG. 21 is a cross-sectional view illustrating a process of manufacturing a semiconductor device following FIG. 20.
Figure 22:
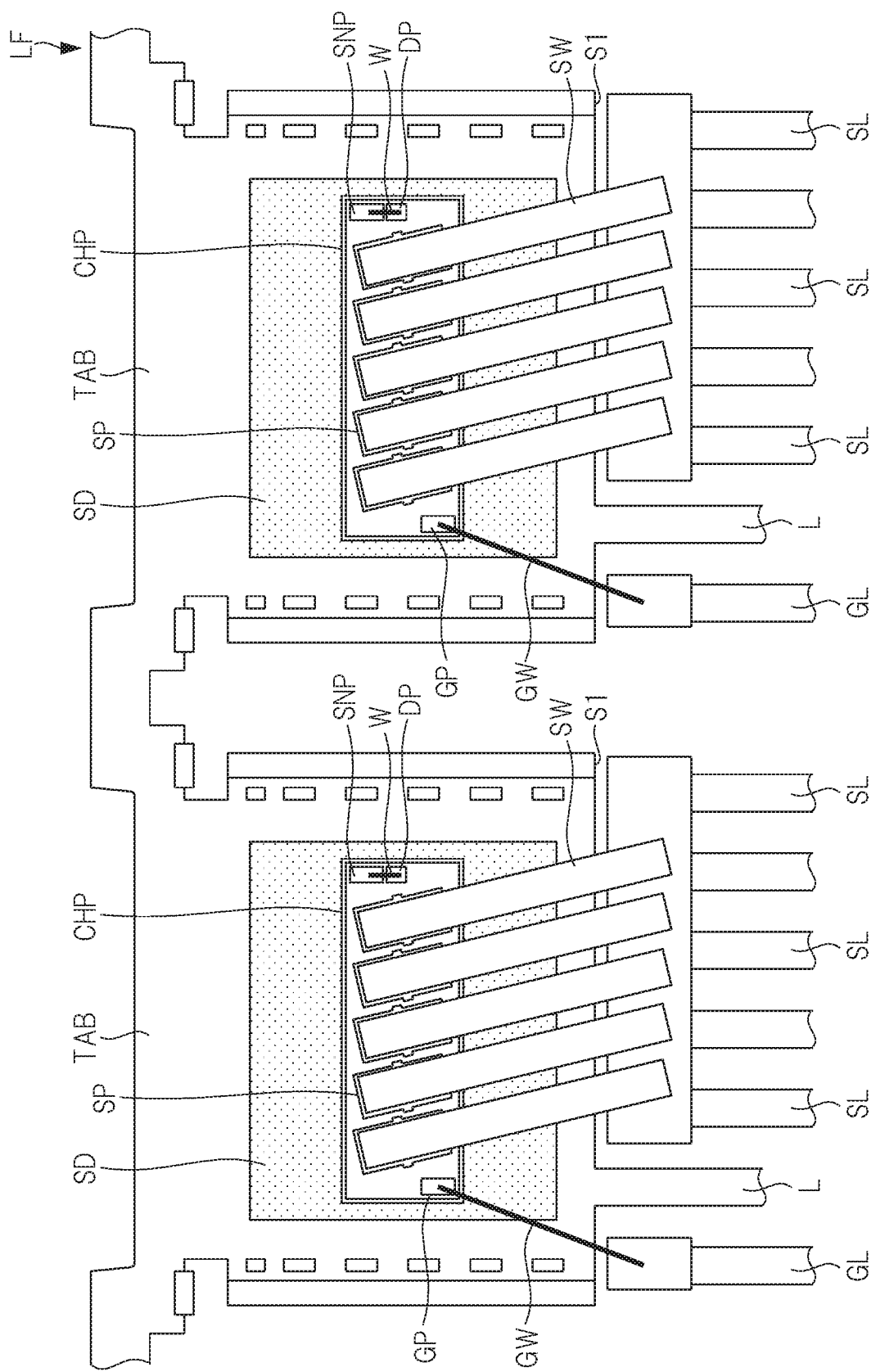
FIG. 22 is a cross-sectional view illustrating a process of manufacturing a semiconductor device following FIG. 21.

Subsequently, as shown in FIG. 20, the source pad SP formed on the surface of the semiconductor chip CHP and the post of the source lead SL on which the plating film made of nickel is formed are connected by the source wire SW. Thereafter, as shown in FIG. 21, the snubber capacitor pad SNP formed on the surface of the semiconductor chip CHP and the drain pad DP formed on the surface of the semiconductor chip CHP are connected by a wire W. Then, as shown in FIG. 22, the gate pad GP formed on the surface of the semiconductor chip CHP and the post portion of the gate pad GL on which the plating film made of nickel is formed are connected by the gate wire GW.

Figure 23:
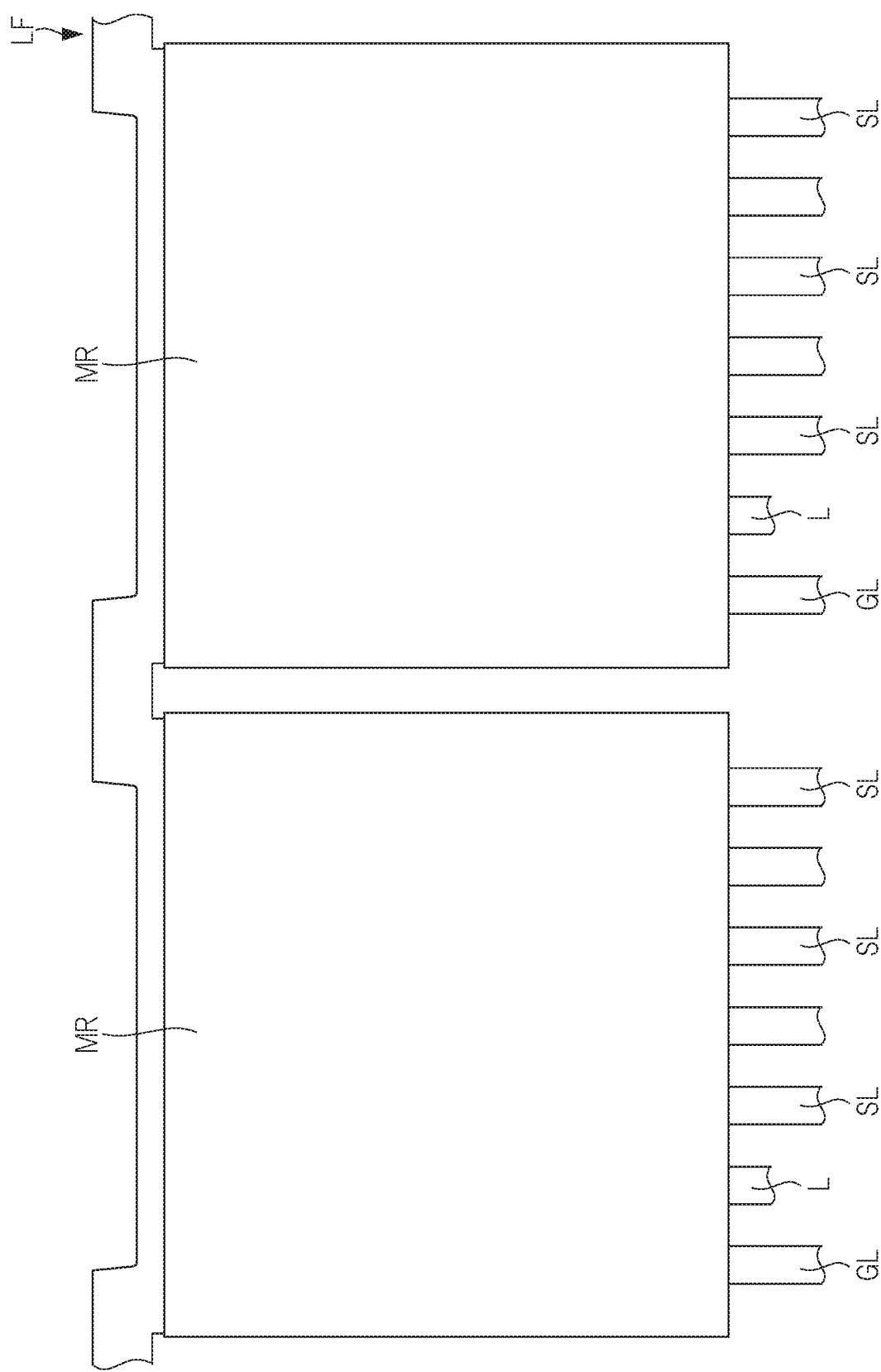
FIG. 23 is a cross-sectional view illustrating a process of manufacturing a semiconductor device following FIG. 22.

Next, as shown in FIG. 23, the chip mounting portion (TAB) on which the semiconductor chip (CHP) is mounted, the source wire (SW), the gate wire (GW), and the wire (W) are sealed with a sealing body MR made of resin, for example. At this time, a part of the gate lead GL, a part of the source lead SL, and a part of the lead L are exposed from the sealing body. Thereafter, a plating film is formed on the surface of the lead (gate lead GL, lead L, source lead SL) exposed from the sealing body MR, and then the lead is molded (a lead molding process). After the semiconductor device is singulated (a singulation process), a marking step and a characteristic selection step are performed. As described above, the semiconductor device in this embodiment can be manufactured.

A Feature in an Embodiment

Next, feature points in the present embodiment will be described. The first characteristic point of the present embodiment is that, for example, as shown in FIG. 10, the snubber capacitor pad SNP and the drain pad DP are formed on the surfaces of the semiconductor chip CHP on which the power MOSFET and the snubber capacitor are formed, and the snubber capacitor pad SNP and the drain pad DP are connected by a connecting member (wire W). Thus, at the stage of the screening test for testing the dielectric strength of the capacitor insulating film constituting the snubber capacitor, the snubber capacitor pad SNP and the drain pad DP are not connected by the connecting member (wire W), and the drain pad DP of the power MOSFET and the snubber capacitor pad SNP of the snubber capacitor are not electrically connected (see FIGS. 13 to 15). On the other hand, in the stage after the screening test is performed, the snubber capacitor pad SNP and the drain pad DP are connected by the connection member (wire W), whereby the drain pad DP and the snubber capacitor pad SNP can be electrically connected (see FIG. 22).

As a result, according to the present embodiment, the dielectric strength of the capacitor insulating film constituting the snubber capacitor can be reliably tested, and the power MOSFET and the snubber capacitor SC can be connected in parallel after the screening test is completed. As a result, it is possible to suppress the generation of a large back electromotive force (surge voltage) in the semiconductor device while improving the yield of the semiconductor device including the power MOSFET and the snubber voltage due to the fact that the screening test can be performed, and it is possible to reduce the component mounting area and the number of components on the mounting board for mounting the semiconductor device, as compared with the configuration in which the snubber voltage is externally attached.

Next, the second feature point in the present embodiment is that, for example, as shown in FIG. 10, the gate pad GP is arranged close to the intersection of the chip side CS1 and the chip side CS3 of the semiconductor chip CHP, while the snubber capacitor pad SNP is arranged close to the intersection of the chip side CS3 and the chip side CS4 of the semiconductor chip CHP. As a result, since the snubber capacitor pad SNP is arranged in the vicinity of the corner portion away from the central portion of the semiconductor chip CHP, it is possible to arrange the snubber capacitor pad SNP on the surface of the semiconductor chip CHP without sacrificing the space in the central portion of the semiconductor chip CHP. That is, according to the second feature of the present embodiment, the snubber capacitor pad SNP can be arranged on the surface of the semiconductor chip CHP without sacrificing the space in the center portion of the semiconductor chip CHP where the source pad SP is arranged. That is, the source pad SP functions as a source of the power MOSFET, and a large current flows through the source pad SP. Therefore, from the viewpoint of improving the performance of the power MOSFET, it is essential to make the area occupied by the plurality of source pads SP on the surfaces of the semiconductor chips CHP as large as possible to reduce the on-resistance of the semiconductor chips CHP. In this regard, according to the second characteristic point of the present embodiment, the snubber capacitor pad SNP is arranged in the vicinity of the corner portion of the semiconductor chip CHP while avoiding the center portion of the semiconductor chip CHP where the plurality of source pads SP are arranged. Therefore, according to the second feature of the present embodiment, the occupied area of the plurality of source pads SP on the surface of the semiconductor chip CHP can be made as large as possible while disposing the snubber capacitor pad SNP on the surface of the semiconductor chip CHP. As a result, it is possible to perform a screening test of the snubber capacitor using the snubber capacitor pad SNP while reducing the on-resistance of the power MOSFET. Therefore, according to the second characteristic point of the present embodiment, while the performance of the semiconductor device is improved by reducing the on-resistance of the power MOSFET, the yield of the semiconductor device can be improved by enabling the screening test of the snubber capacitor using the snubber capacitor pad SNP.

Further, according to the second feature of the present embodiment, the gate pad GP and the snubber capacitor pad SNP are arranged at different corners of the semiconductor chip CHP. That is, according to the second characteristic point of the present embodiment, the gate pad GP and the snubber capacitor pad SNP are distributed and arranged. This makes it possible to effectively utilize the dead space in which the plurality of source pads SP cannot be arranged without changing the arrangement of the plurality of source pads SP, thereby minimizing the design change of the layout of the semiconductor chip CHP. That is, according to the second feature of the present embodiment, it is possible to improve the yield of the semiconductor device by making it possible to perform the screening test of the snubber capacitor using the snubber capacitor pad SNP while suppressing an increase in the manufacturing cost associated with a design change of the layout of the semiconductor chip CHP.

Next, the third characteristic point in the present embodiment is that, for example, as shown in FIG. 10, the drain pad DP is arranged close to the snubber capacitor pad SNP. This makes it possible to shorten the length of the wire W connecting the snubber capacitor pad SNP and the drain pad DP. This means that the parasitic inductances of the wires W can be reduced, thereby suppressing the magnitude of the surge voltages generated when the power MOSFET is turned on or turned off. For example, while the snubber capacitor pad SNP needs to be electrically separated from the drain of the power MOSFET in the stage of the screening test, the snubber capacitor pad SNP needs to be electrically connected to the drain of the power MOSFET in the stage of the final semiconductor device because the power MOSFET and the snubber capacitor need to be connected in parallel. In this regard, for example, as shown in FIG. 12, the semiconductor substrate SUB and the epitaxial layer EPI function as drain regions of the power MOSFET. Therefore, in order to electrically connect the snubber capacitor pad SNP and the drains of the power MOSFET, the snubber capacitor pad SNP and the epitaxial layer EPI may be electrically connected to each other. However, it is physically difficult to electrically connect the snubber capacitor pad SNP formed on the front surface of the semiconductor chip CHP and the semiconductor substrate SUB exposed on the back surface of the semiconductor chip CHP. Here, for example, as shown in FIG. 10, since the semiconductor chip CHP is mounted on the chip mounting portion TAB via the solder SD, the chip mounting portion TAB is electrically connected to the semiconductor substrate SUB. That is, the chip-mounting portion TAB also has the same potential as the drain of the power MOSFET. Therefore, for example, in FIG. 10, in order to connect the power MOSFET and the snubber capacitor in parallel, it is considered that the snubber capacitor pad SNP formed on the front surface of the semiconductor chip CHP and a portion of the chip mounting portion TAB on which the semiconductor chip CHP is not mounted are connected by wires. However, in this case, since the plating film is not formed on the chip mounting portion TAB, connection between the chip mounting portion TAB and the wire becomes difficult. That is, for example, as shown in FIG. 16, a plating film is formed on the portion connected to the wire (see dot region in FIG. 16). Therefore, in order to connect the snubber capacitor pad SNP and the chip mounting portion TAB by a wire, it is necessary to form a plating film also on the surface of the chip mounting portion TAB. However, when the plating film is formed on the entire surface of the chip mounting portion having a large area, the manufacturing cost of the semiconductor device is greatly increased. Therefore, in the present embodiment, for example, as shown in the drain pad forming region A2 of FIG. 12, the drain pad DP is formed on the surface of the semiconductor chip CHP, and the drain pad DP and the epitaxial layer EPI serving as the drain region of the power MOSFET are electrically connected to each other by a plug PLG1~PLG3. As a result, the drain pad DP and the snubber capacitor pad SNP formed on the surface of the semiconductor chip CHP are connected to each other, whereby the power MOSFET and the snubber capacitor are connected in parallel. As described above, as a precondition of the third characteristic point in the present embodiment, the technical significance of providing the drain pad DP on the surfaces of the semiconductor chip CHP is that the snubber capacitor pad SNP is easily electrically connected to the drains of the power MOSFET without causing a significant increase in manufacturing costs. With this configuration as a premise, according to the third feature of the present embodiment in which the drain pad DP is disposed close to the snubber capacitor pad SNP, the length of the wire W connecting the snubber capacitor pad SNP and the drain pad DP can be shortened. As a result, according to the third characteristic point in the present embodiment. By connecting the snubber capacitor pad SNP and the drain pad DP with the wire W, the power MOSFET and the snubber capacitor can be connected in parallel, and the increase of the parasitic inductance caused by the wire W can be suppressed to a minimum.

Next, the fourth feature point in the present embodiment is that the planar size of the snubber capacitor pad SNP is larger than the planar size of the drain pad DP, for example, as shown in FIG. 10. As a result, it is possible to improve the connection strength of the wire connecting the snubber capacitor pad SNP and the drain pad DP while performing the screening test using the snubber capacitor pad SNP. This point will be described below. For example, in a snubber capacity screening test, a probe needle is brought into contact with the snubber capacitor pad SNP. As a result, a probe mark is formed on the snubber capacitor pad SNP by the contact of the probe needle. When a probe mark is formed on the surface of the snubber capacitor pad SNP, the unevenness of the surface of the snubber capacitor pad becomes large. When the wire W is connected onto such a probe trace having large unevenness, the reliability of connection between the snubber capacitor pad SNP and the wire W is lowered by the unevenness caused by the probe trace. Therefore, in the present embodiment, the planar size of the snubber capacitor pad SNP is increased, and a probe needle contact portion to be brought into contact with the probe needle and a wire connection portion to be connected to the wire W are separately provided in the snubber capacitor pad SNP. As a result, since separate regions of the probe needle contact portion and the wire connection portion are secured on the surface of the snubber capacitor pad SNP, even if the probe mark is formed on the probe needle contact portion to be brought into contact with the probe needle, the probe mark is not formed on the wire connection portion, and the flatness of the surface is secured. As a result, according to the snubber capacitor pad SNP of the present embodiment, it is possible to improve the connection strength between the snubber capacitor pad SNP and the wire while ensuring the execution of the screening test using the snubber capacitor pad SNP. On the other hand, since the drain pad DP is not used in the screening test of the snubber capacitor, needles of the probe needles are not applied. Therefore, in the drain pad DP, it is not necessary to secure a region to be in contact with the probe needle, and it is only necessary to secure a connection region to the wire. Therefore, the planar size of the drain pad DP in the present embodiment is smaller than the planar size of the snubber capacitor pad SNP in the present embodiment. In this manner, according to the fourth characteristic point of the present embodiment, it is possible to minimize the total occupied area (plane size) of the snubber capacitor pad SNP and the drain pad DP while considering the execution of the screening test using the snubber capacitor pad SNP.

Next, a fifth characteristic point in the present embodiment is that, for example, as shown in FIGS. 13 to 15, a screening test of the snubber capacitor formed in each chip region CR is performed in the state of the semiconductor wafer WF. In this case, as an example, by using a probe card, it is possible to collectively perform a screening test of the snubber capacitor formed in each chip region CR in the state of the semiconductor wafer WF. On the other hand, when a screening test is performed on the individual semiconductor chips CHP which are singulated by dicing the semiconductor wafer WF, a considerable time is required. That is, according to the fifth characteristic point in the present embodiment, the screening test can be made more efficient, and as a result, the TAT (Turn Around Time) can be greatly shortened.

Next, a sixth feature of the present embodiment is that, for example, as shown in FIGS. 20 to 22, after the source pad SP and the source lead SL (post portion of the source lead SL) are connected by the source wire SW, the snubber capacitor pad SNP and the drain pad DP are connected by the wire W. This makes it possible to suppress cutting of the wire W connecting the snubber capacitor pad SNP and the drain pad DP. This point will be described below. For example, since a large current flows through the source wire SW connecting the source pad SP and the source lead SL, the diameter of the source wire SW increases. On the other hand, as much current as the current flowing through the source wire W does not flow through the wire W connecting the snubber capacitor pad SNP and the drain pad DP. Therefore, the diameter of the wire W is smaller than the diameter of the source wire SW.

The wire bonding process for connecting the source pad SP and the source lead SL (post portion of the source lead SL) by the source wire SW is performed while applying an ultrasonic wave. At this time, since the diameter of the source wire SW is large, the intensity of the ultrasonic wave is also large. Therefore, if the wire bonding process for connecting the source pad SP and the source lead SL (post portion of the source lead SL) is first performed in a state where the snubber capacitor pad SNP and the drain pad DP are connected by the wire W, there is a possibility that the wire W having a small diameter is cut by transmitting the ultrasonic vibration having a large intensity to the wire W. Therefore, in the present embodiment, after the source pad SP and the source lead SL are connected by the source wire SW, the snubber capacitor pad SNP and the drain pad DP are connected by the wire W. Thus, according to the sixth feature of the present embodiment, it is possible to effectively prevent cutting of the wire W connecting the snubber capacitor pad SNP and the drain pad DP.

Next, the seventh characteristic point in the present embodiment is that, as shown in FIGS. 21 to 22, for example, the diameter of the wire W connecting the snubber capacitor pad SNP and the drain pad DP is equal to the diameter of the gate wire GW connecting the gate pad GP and the gate lead GL (post portion of the gate lead GL). Thus, the wire bonding apparatus used in the wire bonding process for connecting the gate pad GP and the gate lead GL with the gate wire W can also be used in the wire bonding process for connecting the snubber capacitor pad SNP and the drain pad DP with the wire W. As a result, according to the seventh feature of the present embodiment, it is possible to suppress the complexity of the manufacturing process of the semiconductor device, thereby suppressing an increase in the manufacturing cost of the semiconductor device.

Next, an eighth characteristic point of the present embodiment is that, for example, as shown in the power MOSFET forming area A 1 of FIG. 12, the snubber capacitor is provided by effectively utilizing spaces existing above the gate electrodes GE. As a result, the snubber capacitor can be mixed and mounted inside the semiconductor chip CHP on which the power MOSFET is formed without causing an increase in the size of the semiconductor chip CHP.

Here, in the power MOSFET of the super junction structure, the levels of noise (EMI noise and electromagnetic wave noise) at specified frequencies tend to be higher than those of a normal power MOSFET which is not the super junction structure. The reason for this is considered to be that the parasitic capacitance differs depending on the difference in the device structure, and thus the noise level differs at the time of switching, i.e., at the time of turn-on or turn-off. That is, it is considered that the parasitic capacitance is smaller than the normal power MOSFET in the power MOSFET of the super junction structure due to the difference in the device structure, and the relaxation effects of the linking peak voltage caused by the parasitic capacitance, i.e., the surge voltage caused by the back electromotive force, are smaller. As a result, in the power MOSFET of the super junction structure, the necessity of adding the snubber capacitor to the inside of the semiconductor chip is higher than that of the normal power MOSFET.

However, adding snubber capacitor to the inside of the semiconductor chip inevitably leads to an increase in chip size. In this regard, particularly in the power MOSFET of the super junction structure, the usefulness of providing the snubber capacitor by effectively utilizing the spaces existing above the gate electrodes GE as shown in, for example, the power MOSFET forming regions A 1 of FIG. 12 is increased. This is because, in the power MOSFET of the super junction structure, since the relaxation effect of the linking peak voltage (surge voltage due to the back electromotive force) due to the parasitic capacitance is smaller than that in the normal power MOSFET, the need for the relaxation effect of the linking peak voltage (surge voltage due to the back electromotive force) due to the addition of the snubber capacitor is increased. Therefore, particularly in the power MOSFET of the super junction structure, since the necessity of providing the snubber capacitor inside the semiconductor chip is large, the usefulness of employing the eighth characteristic point in the present embodiment, which is a device for providing the snubber capacitor inside the semiconductor chip, is increased without causing an increase in the chip size. However, the eighth characteristic point in the present embodiment can be widely applied not only to a configuration in which the power MOSFET and the snubber capacitor of the super junction structure are mixed but also to a configuration in which the normal power MOSFET and the snubber capacitor are mixed.

The Modification 1 of the Embodiment

Figure 24:
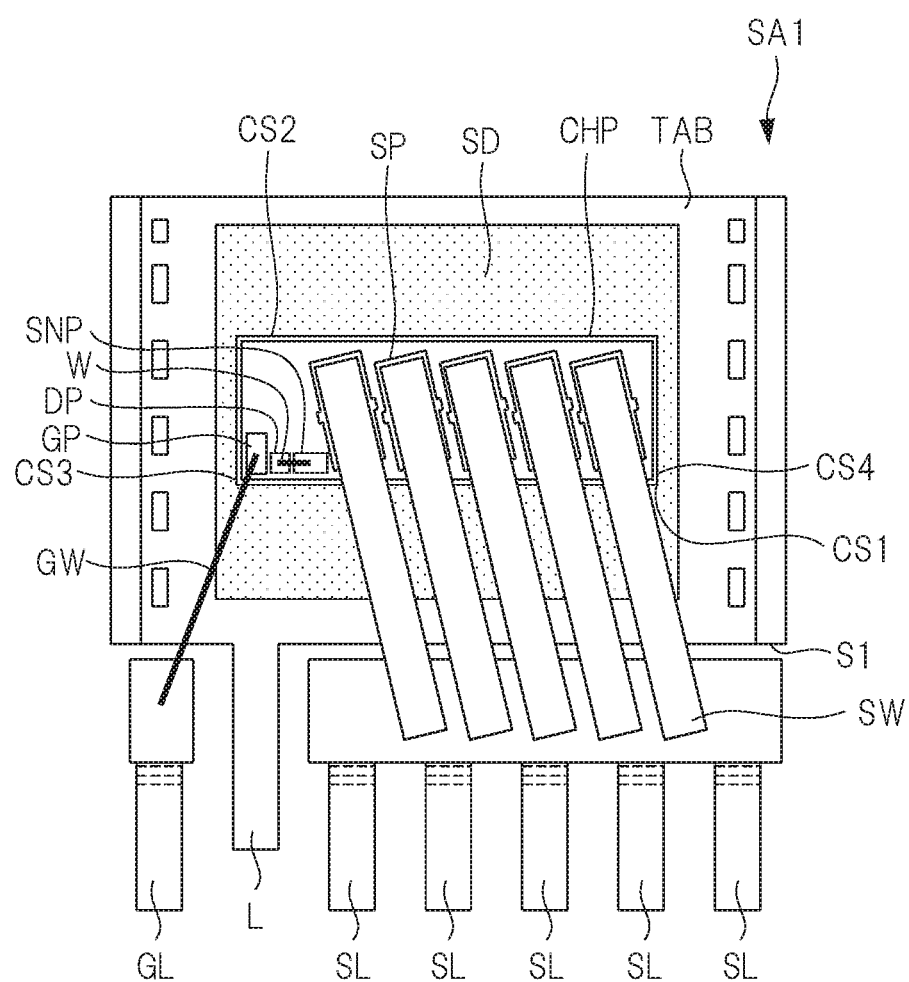
FIG. 24 is a diagram illustrating a schematic configuration of a semiconductor device according to a modification 1 of the embodiment.

FIG. 24 is a diagram showing a schematic configuration of a semiconductor device SA1 in the modification 1 of the embodiment. In FIG. 24, in the first modification, the gate pad GP, the snubber capacitor pad SNP, and the drain pad DP are arranged on the semiconductor chip CHP along the chip side CS 1. In this manner, the snubber capacitor pad SNP and the drain pad DP can be arranged in a layout. Even in this case, it is possible to realize the basic idea that the drain pad DP of the power MOSFET and the snubber capacitor pad SNP of the snubber capacitor are not electrically connected to each other in the stage of testing the dielectric strength of the capacitor insulating film constituting the snubber capacitor, while the drain pad DP and the snubber capacitor pad SNP are electrically connected to each other in the stage after the screening test is performed.

The Modification 2 of the Embodiment

Figure 25:
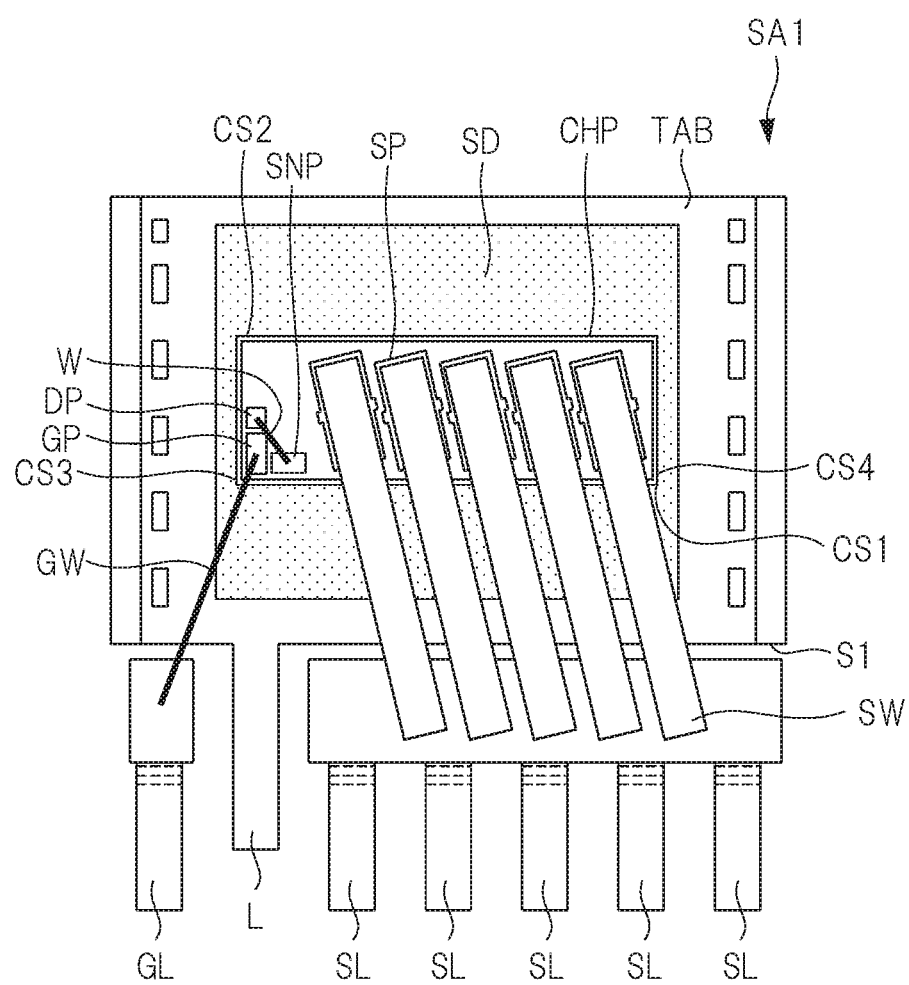
FIG. 25 is a diagram illustrating a schematic configuration of a semiconductor device according to a modification 2 of the embodiment.

FIG. 25 is a diagram showing a schematic configuration of a semiconductor device SA 1 in the modification 2 of the embodiment. In FIG. 25, in the second modification, the gate pad GP is disposed close to the intersection of the chip side CS1 and the chip side CS3. In other words, the gate pad GP is disposed at a corner portion where the chip side CS1 and the chip side CS3 intersect. The gate pad GP and the snubber capacitor pad SNP are arranged along the chip side CS1, and the gate pad GP and the drain pad DP are arranged along the chip side CS3. Conversely, the gate pad GP and the snubber capacitor pad SNP may be arranged along the chip side CS3, and the gate pad GP and the drain pad DP may be arranged along the chip side CS1. In this manner, the snubber capacitor pad SNP and the drain pad DP can be arranged in a layout. Even in this case, it is possible to realize the basic idea that the drain pad DP of the power MOSFET and the snubber capacitor pad SNP of the snubber capacitor are not electrically connected to each other in the stage of testing the dielectric strength of the capacitor insulating film constituting the snubber capacitor, while the drain pad DP and the snubber capacitor pad SNP are electrically connected to each other in the stage after the screening test is performed.

The Modification 3 of the Embodiment

Figure 26:
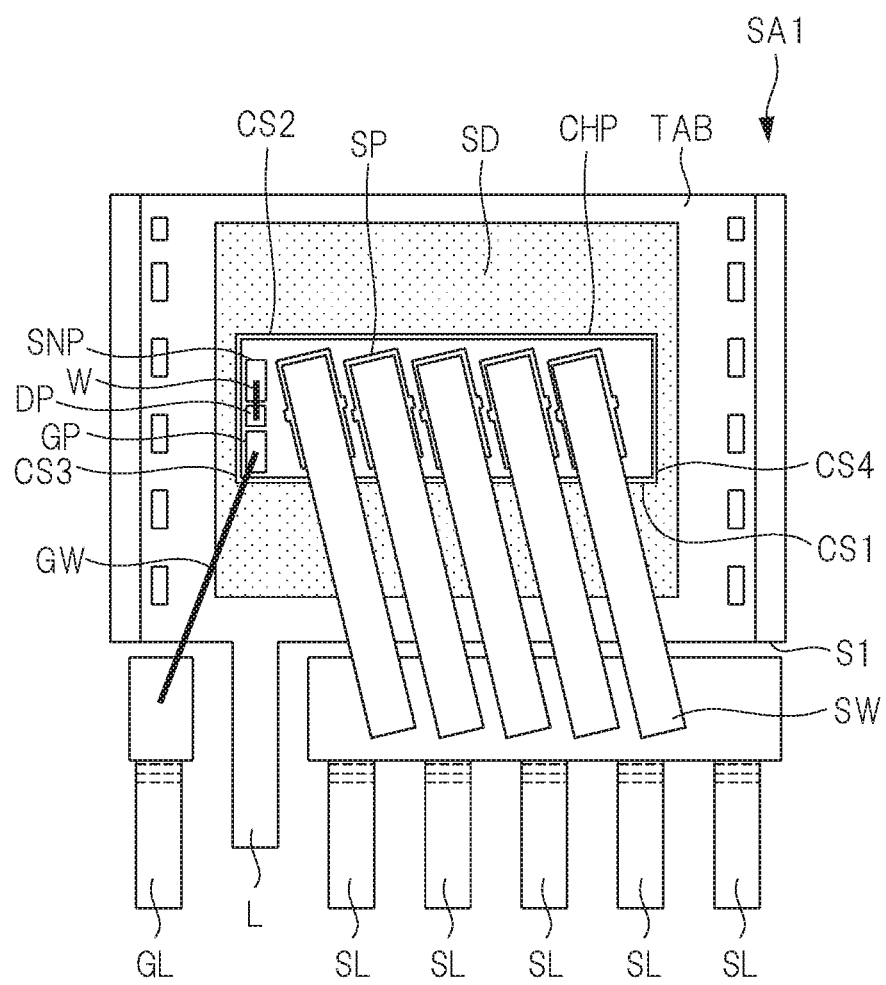
FIG. 26 is a diagram illustrating a schematic configuration of a semiconductor device according to a modification 3 of the embodiment.

FIG. 26 is a diagram showing a schematic configuration of a semiconductor device SA1 in the modification 3 of the embodiment. In FIG. 26, in the third modification, the gate pad GP, the snubber capacitor pad SNP, and the drain pad DP are arranged along the chip side CS3. In this manner, the snubber capacitor pad SNP and the drain pad DP can be arranged in a layout. Even in this case, it is possible to realize the basic idea that the drain pad DP of the power MOSFET and the snubber capacitor pad SNP of the snubber capacitor are not electrically connected to each other in the stage of testing the dielectric strength of the capacitor insulating film constituting the snubber capacitor, while the drain pad DP and the snubber capacitor pad SNP are electrically connected to each other in the stage after the screening test is performed.

The Modification 4 of the Embodiment

Figure 27:
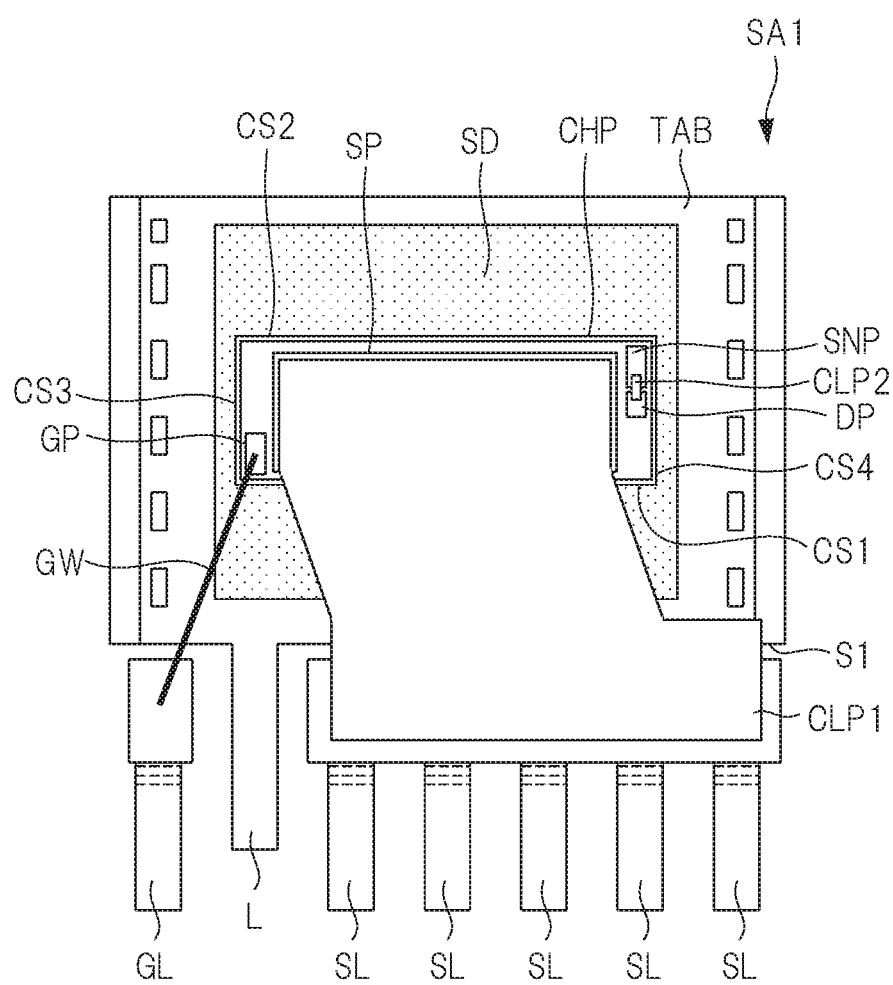
FIG. 27 is a diagram illustrating a schematic configuration of a semiconductor device according to a modification 4 of the embodiment.

FIG. 27 is a diagram showing a schematic configuration of a semiconductor device SA1 in the modification 4 of the embodiment. In FIG. 27, in the fourth modification, the source pad SP formed on the surfaces of the semiconductor chips CHP and the source leads SL are connected to each other by, for example, a copper-clip CLP1. Similarly, in the fourth modification, the snubber capacitor pad SNP and the drain pad DP are connected to each other by a clip CLP2.

Even in this case, it is possible to realize the basic idea that the drain pad DP of the power MOSFET and the snubber capacitor pad SNP of the snubber capacitor are not electrically connected to each other in the stage of testing the dielectric strength of the capacitor insulating film constituting the snubber capacitor, while the drain pad DP and the snubber capacitor pad SNP are electrically connected to each other in the stage after the screening test is performed.

The Modification 5 of the Embodiment

Figure 28:
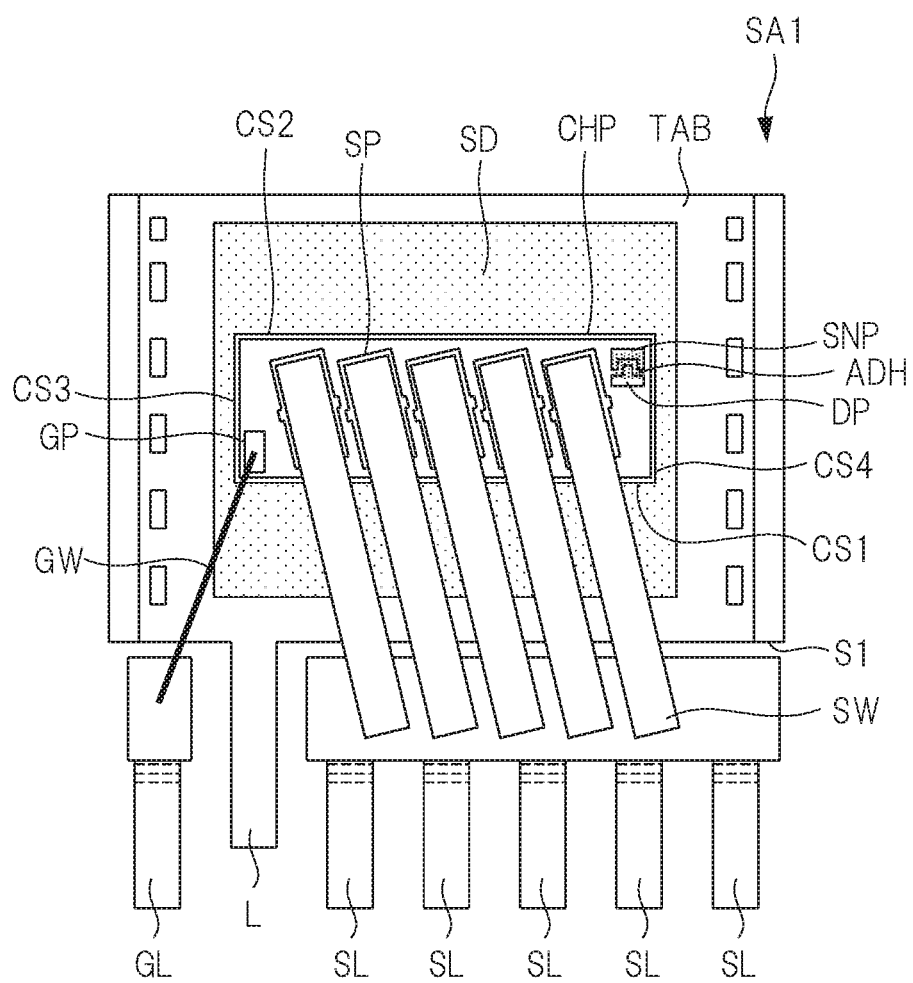
FIG. 28 is a diagram illustrating a schematic configuration of a semiconductor device according to a modification 5 of the embodiment.

FIG. 28 is a diagram showing a schematic configuration of a semiconductor device SA1 in the modification 5 of the embodiment. In FIG. 28, in the fifth modification, the snubber capacitor pad SNP and the drain pad DP are connected by the conductive adhesive ADH.

Even in this case, it is possible to realize the basic idea that the drain pad DP of the power MOSFET and the snubber capacitor pad SNP of the snubber capacitor are not electrically connected to each other in the stage of testing the dielectric strength of the capacitor insulating film constituting the snubber capacitor, while the drain pad DP and the snubber capacitor pad SNP are electrically connected to each other in the stage after the screening test is performed.

The Modification 6 of the Embodiment

Figure 29:
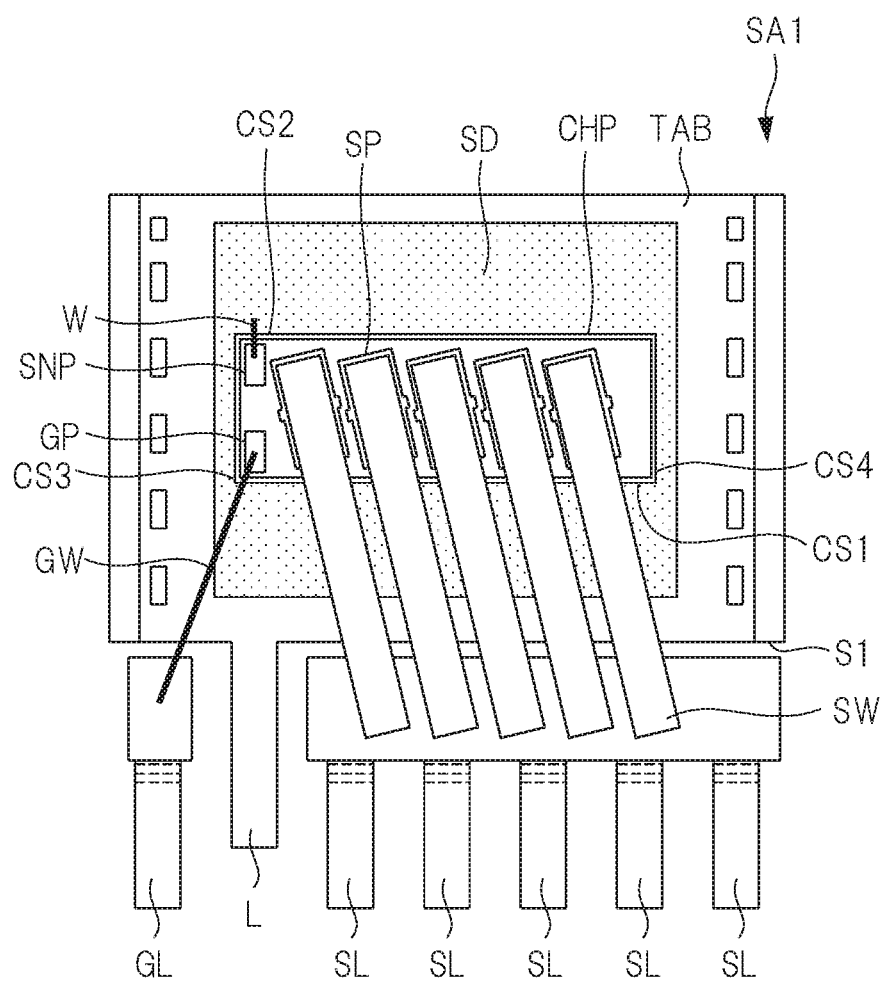
FIG. 29 is a diagram illustrating a schematic configuration of a semiconductor device according to a modification 6 of the embodiment.

FIG. 29 is a diagram showing a schematic configuration of a semiconductor device SA1 in the modification 6 of the embodiment. For example, as shown in FIG. 29, since the semiconductor chip CHP is mounted on the chip mounting portion TAB via the solder SD, the chip mounting portion TAB is electrically connected to the semiconductor substrate. That is, the chip-mounting portion TAB also has the same potential as the drain of the power MOSFET. Therefore, for example, in FIG. 29, in the sixth modification, in order to connect the power MOSFET and the snubber capacitor in parallel, the snubber capacitor pad SNP formed on the front face of the semiconductor chip CHP and a portion of the chip mounting portion TAB on which the semiconductor chip CHP is not mounted are connected by the wire W. In this case, it is unnecessary to provide the drain pad DP on the surface of the semiconductor chip CHP.

However, since the plating film is not formed on the chip mounting portion TAB, connection between the chip mounting portion TAB and the wire W becomes difficult. That is, for example, as shown in FIG. 16, a plating film is formed on the portion connected to the wire (see dot region in FIG. 16). Therefore, in order to connect the snubber capacitor pad SNP and the chip mounting portion TAB by a wire, it is necessary to form a plating film also on the surface of the chip mounting portion TAB. However, when the plating film is formed on the entire surface of the chip mounting portion having a large area, the manufacturing cost of the semiconductor device is greatly increased. Therefore, from the viewpoint of suppressing the connection reliability and the manufacturing cost of the wire W, for example, as in the embodiment shown in FIG. 10, it is preferable to have a configuration in which the snubber capacitor pad SNP and the drain pad DP are connected by the wire W.

The Modification 7 of the Embodiment

Figure 30:
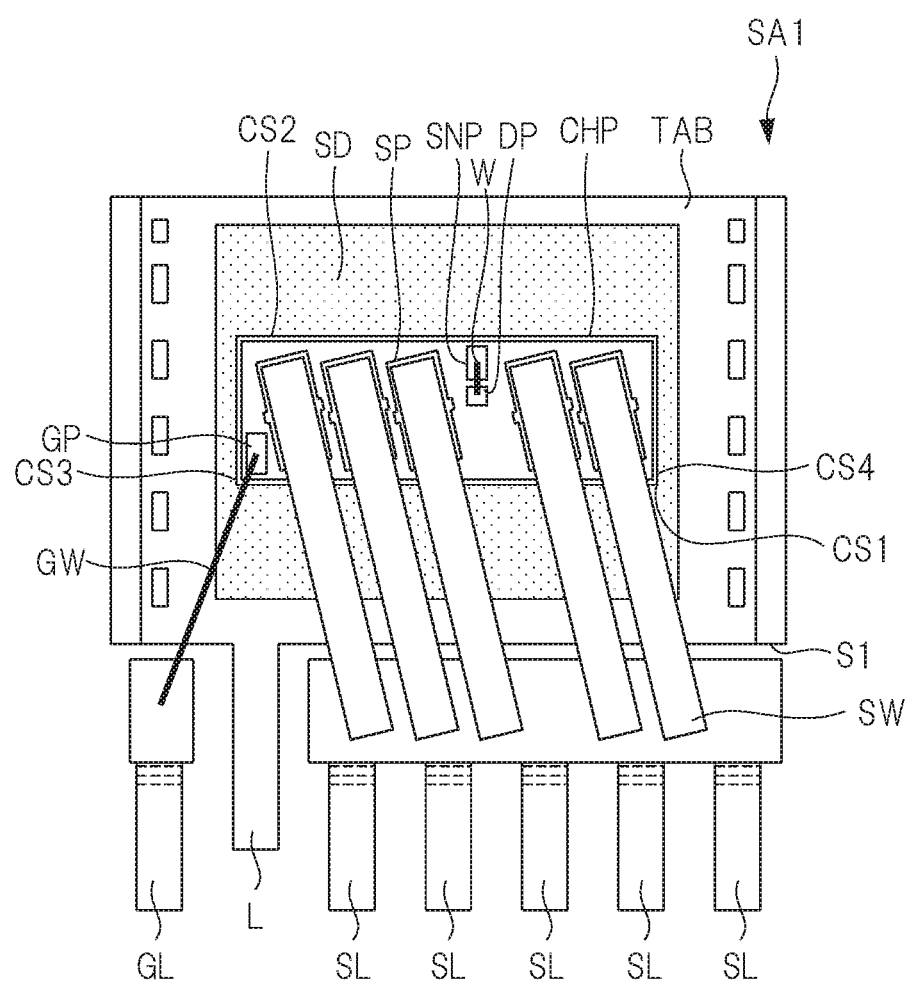
FIG. 30 is a diagram illustrating a schematic configuration of a semiconductor device according to a modification 7 of the embodiment.

FIG. 30 is a diagram illustrating a schematic configuration of a semiconductor device SA1 according to the modification 7 of the embodiment. In FIG. 30, in the seventh modification, a snubber capacitor pad SNP and a drain pad DP are provided at the center of a semiconductor chip CHP, and the snubber capacitor pad SNP and the drain pad DP are connected by a wire W.

Even in this case, it is possible to realize the basic idea that the drain pad DP of the power MOSFET and the snubber capacitor pad SNP of the snubber capacitor are not electrically connected to each other in the stage of testing the dielectric strength of the capacitor insulating film constituting the snubber capacitor, while the drain pad DP and the snubber capacitor pad SNP are electrically connected to each other in the stage after the screening test is performed.

However, in the configuration of the seventh modification, the area of the cell region in the semiconductor chip CHP, i.e., the region in which the cell constituting the power MOSFET is formed, is reduced. Therefore, from the viewpoint of increasing the cell area occupied by the semiconductor chip CHP and reducing the on-resistance of the power MOSFET, for example, it is preferable to arrange the snubber capacitor pad SNP and the drain pad DP at the corner of the semiconductor chip CHP as in the embodiment shown in FIG. 10.

The Modification 8 of the Embodiment

In the embodiment, as an example of a power transistor, a power MOSFET has been described as an example. However, the technical idea in the embodiment is not limited thereto, and may be applied, for example, to the case where an IGBT is employed as a power transistor. At this time, a relation between the semiconductor device SA1 including the power MOSFET and the semiconductor device including the power IGBT is as follows. That is, the source lead SL becomes an emitter lead, the source region becomes an emitter region, the drain region becomes a collector region, and the drain pad DP becomes a collector pad.

The invention made by the present inventor has been described above in detail based on the embodiment, but the present invention is not limited to the embodiment described above, and it is needless to say that various modifications can be made without departing from the gist thereof.

What is claimed is:

1. A semiconductor device comprising:
a chip mounting portion having a first side;
a semiconductor chip mounted on the chip mounting portion; and
a plurality of leads spaced apart from the chip mounting portion, the plurality of leads being arranged along the first side of the chip mounting portion,
wherein the plurality of leads includes:
a gate lead; and
a first lead,
wherein the semiconductor chip has:
a power transistor; and
a snubber capacitor connected in parallel with the power transistor,
wherein the power transistor has:
a gate electrode electrically connected to the gate lead;
a first region electrically connected to the first lead; and
a second region electrically connected to the chip mounting portion,
wherein the snubber capacitor has:
a first capacitor electrode electrically connected to the first region; and
a second capacitor electrode spaced apart from the first capacitor electrode, the second capacitor being arranged to face the first capacitor electrode,
wherein a snubber capacitor pad is formed on a surface of the semiconductor chip, the snubber capacitor pad being electrically connected to the second capacitor electrode of the snubber capacitor,
wherein a second pad is formed on the surface of the semiconductor chip, the second pad being electrically connected to the second region of the power transistor without electrically connecting to the second region through the chip mounting portion, and
wherein the snubber capacitor pad and the second pad are electrically connected to each other via a connection member.

2. The semiconductor device according to claim 1, wherein the connection member is a wire.

3. The semiconductor device according to claim 1, wherein the connection member is a clip.

4. The semiconductor device according to claim 1, wherein the connection member is a conductive adhesive.

5. The semiconductor device according to claim 1, wherein the snubber capacitor pad and the chip mounting portion are connected by a wire.

6. The semiconductor device according to claim 1, wherein the semiconductor chip has:
a first chip side arranged along the first side of the chip mounting portion;
a second chip side arranged opposite side of the first chip side;
a third chip side intersecting the first chip side and the second chip side; and
a fourth chip side intersecting the first chip side and the second chip side and arranged opposite the third chip side.

7. The semiconductor device according to claim 6, wherein a gate pad electrically connected to the gate electrode of the power transistor is formed on the surface of the semiconductor chip, and the gate pad, the snubber capacitor pad, and the second pad are arranged along the first chip side.

8. The semiconductor device according to claim 6, wherein a gate pad electrically connected to the gate electrode of the power transistor is formed on the surface of the semiconductor chip, and the gate pad, the snubber capacitor pad, and the second pad are arranged along the third chip side.

9. The semiconductor device according to claim 6, wherein a gate pad electrically connected to the gate electrode of the power transistor is formed on a surface of the semiconductor chip, the gate pad is disposed close to an intersection of the first chip side and the third chip side, the gate pad and the snubber capacitor pad are disposed along the first chip side, and the gate pad and the second pad are disposed along the third chip side.

10. The semiconductor device according to claim 6, wherein a gate pad electrically connected to the gate electrode of the power transistor is formed on a surface of the semiconductor chip, the gate pad is disposed close to an intersection of the first chip side and the third chip side, the gate pad and the snubber capacitor pad are disposed along the third chip side, and the gate pad and the second pad are disposed along the first chip side.

11. The semiconductor device according to claim 6, wherein a gate pad electrically connected to the gate electrode of the power transistor is formed on a surface of the semiconductor chip, the gate pad is disposed close to an intersection of the first chip side and the third chip side, and the snubber capacitor pad is disposed close to an intersection of the second chip side and the fourth chip side.

12. The semiconductor device according to claim 2, wherein a first pad electrically connected to the first region of the power transistor and a gate pad electrically connected to the gate electrode of the power transistor are formed on a surface of the semiconductor chip, the first pad and the first lead are connected by a first wire, the gate pad and the gate lead are connected by a gate wire, a diameter of the gate wire is smaller than a diameter of the first wire, and a diameter of the wire is smaller than the diameter of the first wire.

13. The semiconductor device according to claim 12, wherein the diameter of the wire and the diameter of the gate wire are equal to each other.

14. The semiconductor device as claimed in claim 1, wherein the power transistor is a power MOSFET, the first lead is a source lead, the first region is a source region, the second region is a drain region, and the second pad is a drain pad.

15. The semiconductor device as claimed in claim 1, wherein the power transistor is an IGBT, the first lead is an emitter lead, the first region is an emitter region, the second region is a collector region, and the second pad is a collector pad.

* * * * *